(12) United States Patent
Mori et al.

(10) Patent No.: US 7,812,521 B2
(45) Date of Patent: Oct. 12, 2010

(54) WHITE LIGHT-EMITTING ORGANIC ELECTROLUMINESCENCE (EL) DEVICE AND METHOD OF ADJUSTING CHROMATICITY OF THE DEVICE

(75) Inventors: Kenji Mori, Kariya (JP); Ichiro Yamamoto, Kariya (JP); Takanori Murasaki, Kariya (JP)

(73) Assignee: Kabushiki Kaisha Toyota Jidoshokki, Aichi-ken (JP)

(*) Notice: Subject to any disclaimer, the term of this patent is extended or adjusted under 35 U.S.C. 154(b) by 294 days.

(21) Appl. No.: 12/221,763

(22) Filed: Aug. 5, 2008

(65) Prior Publication Data

US 2009/0079338 A1  Mar. 26, 2009

(30) Foreign Application Priority Data

Aug. 10, 2007  (JP) .............................. 2007-210469

(51) Int. Cl.
   *H01L 51/50* (2006.01)
(52) U.S. Cl. ............................. 313/504; 445/24; 445/25
(58) Field of Classification Search .................. 313/504; 445/24–25
   See application file for complete search history.

(56) References Cited

U.S. PATENT DOCUMENTS

| 2006/0040132 | A1* | 2/2006 | Liao et al. ................... 428/690 |
| 2006/0046095 | A1* | 3/2006 | Ragini et al. ................ 428/690 |
| 2006/0108592 | A1* | 5/2006 | Nishimura et al. ............ 257/89 |
| 2007/0278937 | A1* | 12/2007 | Forrest et al. ................ 313/504 |
| 2008/0238305 | A1* | 10/2008 | Kondo et al. ................. 313/504 |

FOREIGN PATENT DOCUMENTS

| JP | 2004-063349 | 2/2004 |
| WO | WO2005/117499 | 12/2005 |

* cited by examiner

*Primary Examiner*—Nimeshkumar D Patel
*Assistant Examiner*—Mary Ellen Bowman
(74) *Attorney, Agent, or Firm*—Locke Lord Bissell & Liddell LLP

(57) ABSTRACT

The white light-emitting organic EL device of the present invention comprises: an anode, a cathode, at least a red light-emitting layer, a blue light-emitting layer and a green light-emitting layer provided between the anode and the cathode, and an intermediate layer between any two adjacent layers of the respective light-emitting layers, wherein, when CIE chromaticity coordinates of a dopant incorporated into the red light-emitting layer are represented by $(x_R, y_R)$, CIE chromaticity coordinates of a dopant incorporated into the blue light-emitting layer are represented by $(x_B, y_B)$, CIE chromaticity coordinates of a dopant incorporated into the green light-emitting layer are represented by $(x_G, y_G)$, and target CIE chromaticity coordinates of white light emitted from the device are represented by $(x_t, y_t)$, $\Delta y$ represented as a difference between $y_R$ and $y_B$, and $\Delta x$ represented as a difference between $x_G$ and $x_t$ satisfy the following relationships:

$\Delta y \leq 0.18$ $\Delta x \leq 0.10$.

11 Claims, 6 Drawing Sheets

WHITE LIGHT-EMITTING ORGANIC ELECTROLUMINESCENCE (EL) DEVICE AND METHOD OF ADJUSTING CHROMATICITY OF THE DEVICE

FIELD OF THE INVENTION

The present invention relates to a white light-emitting organic EL device in which at least a red light-emitting layer, a blue light-emitting layer, and a green light-emitting layer are provided between an anode and a cathode, and an intermediate layer is provided between any two adjacent layers of the respective light-emitting layers, and a method of adjusting the chromaticity of the device.

BACKGROUND OF THE INVENTION

Various investigations have been conducted on a white light-emitting organic EL device because the device can be used in a lighting application such as a backlight or a full-color display device using a color filter. The white light-emitting organic EL device has a structure obtained by laminating multiple light-emitting layers, and realizes the emission of white light by mixing luminescent colors from the respective light-emitting layers. The chromaticity of light emitted from each light-emitting layer in such white light-emitting organic EL devices, and the efficiency with which the light-emitting layer emits the light are controlled by trial and error because the chromaticity and the efficiency each vary to a large extent depending on, for example, the amount of dopant in the light-emitting layer (doping ratio) and the thickness of the light-emitting layer.

In view of the foregoing, the following method has been proposed: in order that the emission of white light with a target chromaticity may be efficiently designed, the thickness and doping ratio of each light-emitting layer are each set by using luminous efficiency and the chromaticity coordinates of the color of emitted and extracted light as parameters, and the thickness of at least one of a hole-transporting layer and an electron-transporting layer is set by using the chromaticity coordinates of the color of the emitted and extracted light as parameters in association with the set thickness of each light-emitting layer. For example, JP 2004-63349 A discloses a method of designing a white light-emitting organic EL device in which three light-emitting layers are laminated.

With the related method described in JP 2004-63349 A, the chromaticity of the device can be brought close to a target one in a somewhat efficient fashion by using a large number of parameters including the thickness of each light-emitting layer, the doping ratio of each light-emitting layer, the thickness of the hole-transporting layer, and the thickness of the electron-transporting layer. In actuality, however, the method involves the following problems: the chromaticity coordinates of the device cannot be easily adjusted to target ones with accuracy because the number of parameters to be adjusted is so large that it is difficult to combine the parameters with accuracy and because it is difficult to select, for example, a material for use in each of the light-emitting layers and the order in which the light-emitting layers are laminated appropriately. Also, investigations on the material and the order are still insufficient.

SUMMARY OF THE INVENTION

Therefore, the present invention has been made with a view to solving the above-mentioned conventional problems, and an object of the present invention is to provide a white light-emitting organic EL device the chromaticity coordinates of which can be easily adjusted to target ones with accuracy and a method of adjusting the chromaticity of the device.

The inventors of the present invention, after conducting intensive studies and development for solving the conventional problems described above, have found that the use of materials the CIE chromaticity coordinates of which satisfy predetermined relationships as materials incorporated into a red light-emitting layer, a blue light-emitting layer, and a green light-emitting layer provided between an anode and a cathode so as to be responsible for the emission of light beams with respective colors is effective for solving the problems, to complete the present invention.

That is, a white light-emitting organic EL device according to the present invention comprises: an anode; a cathode; at least a red light-emitting layer, a blue light-emitting layer, and a green light-emitting layer provided between the anode and the cathode; and an intermediate layer formed of one of a hole-transporting material, an electron-transporting material, a hole-blocking material, and an electron-blocking material and provided between any two adjacent layers of the respective light-emitting layers, in which, when CIE chromaticity coordinates of a material incorporated into the red light-emitting layer responsible for emission of red light (red light-emitting material) are represented by $(x_R, y_R)$, CIE chromaticity coordinates of a material incorporated into the blue light-emitting layer responsible for emission of blue light (blue light-emitting material) are represented by $(x_B, y_B)$, CIE chromaticity coordinates of a material incorporated into the green light-emitting layer responsible for emission of green light (green light-emitting material) are represented by $(x_G, y_G)$, and target CIE chromaticity coordinates of white light emitted from the device are represented by $(x_t, y_t)$, $\Delta y$ represented as a difference between $y_R$ and $y_B$, and $\Delta x$ represented as a difference between $x_G$ and $x_t$ satisfy the following relationships:

$$\Delta y \leq 0.18$$

$$\Delta x \leq 0.10.$$

Note that the material responsible for the emission of respective colors means a material capable of extracting the light finally. In addition, "between any two adjacent layers of the respective light-emitting layers" represents "between a red light-emitting layer and a blue light-emitting layer", "between a blue light-emitting layer and a green light-emitting layer", or "between a red light-emitting layer and a green light-emitting layer".

According to a preferred embodiment of the present invention, the white light-emitting organic EL device has preferably: a structure in which at least the red light-emitting layer, the intermediate layer formed of one of the hole-transporting material and the electron-blocking material, the blue light-emitting layer, the green light-emitting layer, and the cathode are provided in this order on the anode; a structure in which at least the green light-emitting layer, the intermediate layer formed of one of the hole-transporting material and the electron-blocking material, the blue light-emitting layer, the red light-emitting layer, and the cathode are provided in this order on the anode; a structure in which at least the red light-emitting layer, the blue light-emitting layer, the intermediate layer formed of one of the electron-transporting material and the hole-blocking material, the green light-emitting layer, and the cathode are provided in this order on the anode; and a structure in which at least the green light-emitting layer, the blue light-emitting layer, the intermediate layer formed of one of the electron-transporting material and the hole-blocking material, the red light-emitting layer, and the cathode are provided in this order on the anode.

In addition, according to still another aspect of the present invention, there is provided a method of adjusting a chromaticity of a white light-emitting organic EL device, in which at least a red light-emitting layer, a blue light-emitting layer, and a green light-emitting layer are provided between an anode and a cathode, and an intermediate layer formed of one of a hole-transporting material, an electron-transporting material, a hole-blocking material, and an electron-blocking material is provided between any two adjacent layers of the respective light-emitting layers, and in which, when CIE chromaticity coordinates of a material incorporated into the red light-emitting layer responsible for emission of red light (red light-emitting material) are represented by $(x_R, y_R)$, CIE chromaticity coordinates of a material incorporated into the blue light-emitting layer responsible for emission of blue light (blue light-emitting material) are represented by $(x_B, y_B)$, CIE chromaticity coordinates of a material incorporated into the green light-emitting layer responsible for emission of green light (green light-emitting material) are represented by $(x_G, y_G)$, and target CIE chromaticity coordinates of white light emitted from the device are represented by $(x_t, y_t)$, $\Delta y$ represented as a difference between $y_R$ and $y_B$, and $\Delta x$ represented as a difference between $x_G$ and $x_t$ satisfy the following relationships:

$$\Delta y \leq 0.18$$

$$\Delta x \leq 0.10,$$

the method comprising changing, when CIE chromaticity coordinates of the white light emitted from the white light-emitting organic EL device deviate from the target CIE chromaticity coordinates $(x_t, y_t)$, thicknesses of part of layers selected from the respective light-emitting layers and the intermediate layer so that the white light approaches the target chromaticity value $x_t$, and thicknesses of part of layers selected from the remainder of the respective light-emitting layers and the intermediate layer so that the white light approaches the target chromaticity value $y_t$.

According to a preferred embodiment of the present invention, in a method of adjusting a chromaticity of a white light-emitting organic EL device, the white light-emitting organic EL device preferably has at least the red light-emitting layer, the intermediate layer formed of one of the hole-transporting material and the electron-blocking material, the blue light-emitting layer, the green light-emitting layer, and the cathode provided in this order on the anode and the method preferably comprises changing one of the thickness of the blue light-emitting layer and the thickness ratio between the blue light-emitting layer and the green light-emitting layer so that the white light approaches the target chromaticity value $y_t$, while changing a thickness of the intermediate layer so that the white light approaches the target chromaticity value $x_t$. The expression "change in a thickness ratio" as used herein means that the thickness of each of the blue light-emitting layer and the green light-emitting layer is changed while the total thickness of the blue light-emitting layer and the green light-emitting layer is not changed.

According to another preferred embodiment of the present invention, in a method of adjusting a chromaticity of a white light-emitting organic EL device, the white light-emitting organic EL device preferably has at least the green light-emitting layer, the intermediate layer formed of one of the hole-transporting material and the electron-blocking material, the blue light-emitting layer, the red light-emitting layer, and the cathode provided in this order on the anode and the method preferably comprises changing the thickness of the intermediate layer so that the white light approaches the target chromaticity value $y_t$, while changing one of the thickness of the blue light-emitting layer and the thickness ratio between the blue light-emitting layer and the red light-emitting layer so that the white light approaches the target chromaticity value $x_t$. The expression "change in a thickness ratio" as used herein means that the thickness of each of the blue light-emitting layer and the red light-emitting layer is changed while the total thickness of the blue light-emitting layer and the red light-emitting layer is not changed.

According to another preferred embodiment of the present invention, in a method of adjusting a chromaticity of a white light-emitting organic EL device, the white light-emitting organic EL device preferably has at least the red light-emitting layer, the blue light-emitting layer, the intermediate layer formed of one of the electron-transporting material and the hole-blocking material, the green light-emitting layer, and the cathode provided in this order on the anode and the method preferably comprises changing the thickness of the intermediate layer so that the white light approaches the target chromaticity value $y_t$, while changing one of the thickness of the blue light-emitting layer and the thickness ratio between the blue light-emitting layer and the red light-emitting layer so that the white light approaches the target chromaticity value $x_t$. The expression "change in a thickness ratio" as used herein means that the thickness of each of the blue light-emitting layer and the red light-emitting layer is changed while the total thickness of the blue light-emitting layer and the red light-emitting layer is not changed.

In the method of adjusting a chromaticity of a white light-emitting organic EL device according to the present invention, the white light-emitting organic EL device preferably has at least the green light-emitting layer, the blue light-emitting layer, the intermediate layer formed of one of the electron-transporting material and the hole-blocking material, the red light-emitting layer, and the cathode provided in this order on the anode and the method preferably comprises changing one of the thickness of the blue light-emitting layer and the thickness ratio between the blue light-emitting layer and the green light-emitting layer so that the white light approaches the target chromaticity value $y_t$, while changing the thickness of the intermediate layer so that the white light approaches the target chromaticity value $x_t$. The expression "change in a thickness ratio" as used herein means that the thickness of each of the blue light-emitting layer and the green light-emitting layer is changed while the total thickness of the blue light-emitting layer and the green light-emitting layer is not changed.

DESCRIPTION OF THE PREFERRED EMBODIMENTS

Hereinafter, a white light-emitting organic EL device according to embodiments of the present invention will be described in more detail with reference to the figures.

Embodiment 1

Figure 1:
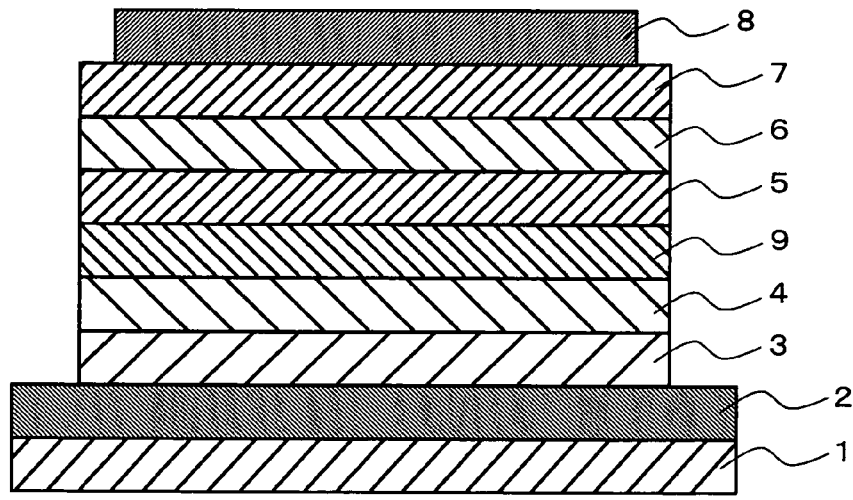
FIG. 1 is a view showing an example of the layer structure of a white light-emitting organic EL device according to Embodiment 1.
Figure 2:
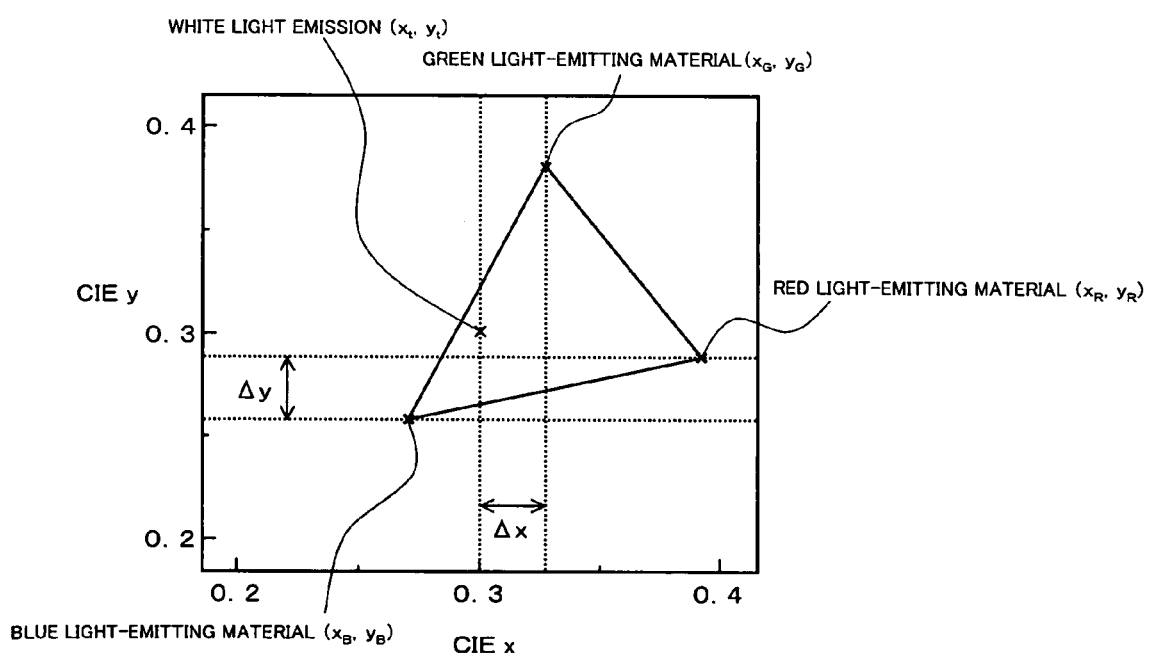
FIG. 2 is a view showing a relationship among respective dopants on CIE chromaticity coordinates in Embodiment 1.

FIG. 1 shows an example of the layer structure of a white light-emitting organic EL device according to Embodiment 1 and FIG. 2 shows a relationship among the respective light-emitting materials on CIE chromaticity coordinates in this case. As shown in FIG. 1, the white light-emitting organic EL device according to Embodiment 1 is obtained by laminating, on a substrate 1, an anode 2, a hole-transporting layer 3, a red light-emitting layer 4 containing a red light-emitting material, an intermediate layer 9, a blue light-emitting layer 5 containing a blue light-emitting material, a green light-emitting layer 6 containing a green light-emitting material, an electron-transporting layer 7, and a cathode 8 sequentially. The white light-emitting organic EL device is constituted to emit white light by mixing luminescent colors from the respective light-emitting layers. Here, when the CIE chromaticity coordinates of the red light-emitting material in the red light-emitting layer 4 are represented by $(x_R, y_R)$, the CIE chromaticity coordinates of the blue light-emitting material in the blue light-emitting layer 5 are represented by $(x_B, y_B)$, the CIE chromaticity coordinates of the green light-emitting material in the green light-emitting layer 6 are represented by $(x_G, y_G)$, and the target CIE chromaticity coordinates of the white light emitted from the device are represented by $(x_t, y_t)$, as seen in FIG. 2, $\Delta y$ represented as a difference between $y_R$ and $y_B$, and $\Delta x$ represented as a difference between $x_G$ and $x_t$ satisfy the following relationships:

$\Delta y \leq 0.18$ $\Delta x \leq 0.10$.

As long as light-emitting materials satisfying such relationships as described above are used, the chromaticity value x of the CIE chromaticity coordinates of the white light can be brought close to the target chromaticity value $x_t$ by increasing or decreasing the thickness of the intermediate layer 9, and the chromaticity value y of the CIE chromaticity coordinates of the white light can be brought close to the target chromaticity value $y_t$ by increasing or decreasing the thickness of the blue light-emitting layer 5 or by changing the thickness ratio between the blue light-emitting layer 5 and the green light-emitting layer 6.

That is, in the white light-emitting organic EL device constituted as described above, an increase in the thickness of the intermediate layer 9 can decrease the chromaticity value x of the chromaticity coordinates of the color of emitted and extracted light (adjust the color to a bluish color tone) while leaving the chromaticity value y of the chromaticity coordinates of the color of the emitted and extracted light nearly unchanged. In contrast, a decrease in the thickness of the intermediate layer 9 can increase the chromaticity value x of the chromaticity coordinates of the color of the emitted and extracted light (adjust the color to a reddish color tone) while leaving the chromaticity value y of the chromaticity coordinates of the color of the emitted and extracted light nearly unchanged. In addition, a decrease in the thickness of the blue light-emitting layer 5, or a decrease in the ratio of the thickness of the blue light-emitting layer 5 to the thickness of the green light-emitting layer 6 can increase the chromaticity value y of the chromaticity coordinates of the color of the emitted and extracted light (adjust the color to a greenish color tone) while leaving the chromaticity value x of the chromaticity coordinates of the color of the emitted and extracted light nearly unchanged. In contrast, an increase in the thickness of the blue light-emitting layer 5, or an increase in the ratio of the thickness of the blue light-emitting layer 5 to the thickness of the green light-emitting layer 6 can decrease the chromaticity value y of the chromaticity coordinates of the color of the emitted and extracted light while leaving the chromaticity value x of the chromaticity coordinates of the color of the emitted and extracted light nearly unchanged.

It should be noted that the chromaticity coordinates of a light-emitting material in each light-emitting layer can be measured by the photoluminescence of a film in the same state as that of the light-emitting layer. For example, when a light-emitting layer is formed of a host material and a light-emitting dopant material, it is sufficient to adopt the following procedure: a film doped with the light-emitting dopant material at the same concentration as that of a film in the organic EL device is formed in isolation from the device, the photoluminescence spectrum of the film is measured, and the chromaticity coordinates of the light-emitting dopant material are calculated. When a light-emitting layer is composed only of a host, it is sufficient to subject a film composed only of the host to measurement similar to that described above. It should be noted that, when a light-emitting layer is of such a type as to be doped with a dopant at a low concentration, the photoluminescence spectrum of a solution prepared by dissolving the dopant in a solvent at a low concentration may be used in place of the photoluminescence spectrum of the layer.

The red light-emitting layer 4 is a layer containing at least the red light-emitting material. The red light-emitting material in the red light-emitting layer 4 emits red light when excitons in the material return to their ground state. A material satisfying the above-mentioned relationship of $\Delta y$ appropriately selected from, for example, known materials each having an ability to emit red light can be used as the red light-emitting material.

As the red light-emitting material, for example, there may be mentioned anthracenes, tetracenes, pentacenes, pyrenes, metal complexes of europium or the like, benzopyranes, 4-(two electrons-withdrawing group-substituted methylidene)-4H-pyrans, 4-(two electrons-withdrawing methylidene)-4H-thiopyrans, rhodamines, benzothioxanthenes, porphyrin derivatives, phenoxazones, periflanthenes, iridium complexes, and platinum complexes. More specifically, there may be mentioned 7-diethylaminobenzo[a]phenoxazine-9H-3-one, [2-t-butyl-6-[trans-2-(2,3,5,6-tetrahydro-1,1,7,7-tetramethyl-benzo[i,j]quinolidine-9-yl)ethenyl]-4H-pyran-4-ilidene]-1,3-pr opanedinitorile, [2-methyl-6-[trans-2-(2,3,5,6-tetrahydro-1,1,7,7-tetramethyl-benzo[i,j]quinolidine-9-yl)ethenyl]-4H-pyran-4-ilidene]-1,3-pro panedinitorile, dibenzotetraphenylperiflanthene, and the like. In addition, a phosphor such as bis(2-phenylpyridine)iridium (III) acetylacetonate, 2,3,7,8,12,13,17,18-octaethyl-21H,23H-porphyrin platinum (II) is also preferred. Of those, periflanthenes such as dibenzotetraphenyl periflanthene, iridium complexes such as bis(2-phenylpyridine)iridium (III) acetylacetonate, platinum complexes, and the like are preferred with view to high color purity and high luminous efficiency.

Further, red light-emitting layer 4 preferably includes a red light-emitting material (dopant) and a red host material. In the foregoing, red can be emitted with high luminous efficiency.

Examples of the red host material that can be used in the red light-emitting layer 4 include triamines, tetramines, benzidines, triarylamines, arylenediamine derivatives, phenylenediamine derivatives, paraphenylene diamine derivatives, methaphenylene diamine derivatives, 1,1-bis(4-diarylaminophenyl)cyclohexanes, 4,4'-di(diarylamino)biphenyls, bis[4-(diarylamino)phenyl]methanes, 4,4"-di(diarylamino)terphenyls, 4,4'''-di(diarylamino)quaterphenyls, 4,4'-di(diarylamino)diphenyl ethers, 4,4'-di(diarylamino)diphenyl sulfanes, bis[4-(diarylamino)phenyl]dimethylmethanes, bis[4-(diarylamino)phenyl]-di(trifluoromethyl)methanes, diphenyl anthracene derivatives, arylanthracene derivatives, carbazole derivatives, quinolinol complex derivatives, fluorene derivatives, and phenylpyridine derivatives. Of those, diphenyl anthracene derivatives, arylanthracene derivatives, carbazole derivatives, quinolinol complex derivatives, fluorene derivatives, and phenylpyridine derivatives are preferred from the viewpoint of high luminous efficiency.

In addition, the content (doping amount) of the red light-emitting material (dopant) is preferably 0.05 wt % or more and 40 wt % or less, or more preferably 0.1 wt % or more and 20 wt % or less with respect to a red host material.

The red light-emitting layer 4 can be formed of any one of those materials by a known film formation method such as sputtering, ion plating, vacuum co-vapor deposition, spin coating, or electron beam co-vapor deposition. The thickness of the red light-emitting layer 4 is preferably 1 nm to 10 nm, or more preferably 1 nm to 8 nm.

The blue light-emitting layer 5 is a layer containing at least the blue light-emitting material. The blue light-emitting material in the blue light-emitting layer 5 emits blue light resulting from radiative deactivation of excitons. A material satisfying the above-mentioned relationship of Δy appropriately selected from, for example, known materials each having an ability to emit blue light can be used as the blue light-emitting material.

As the blue light-emitting material, for example, there may be mentioned pyrenes, perylenes, anthracenes, distyrylamine derivatives, benzooxazoles, quinolinolate-based metal complexes, benzothiazoles, benzomidazoles, chrysenes, phenanthrenes, distyrylbenzenes, distyryl arylenes, divinyl arylenes, tristyryl arylenes, triarylethylenes, tetraaryl butadienes, and iridium complex derivatives. More specifically, there may be mentioned 4,4'-bis(2,2-diphenyl-ethene-1-yl)diphenyl, 4,4'-bis(2,2-diphenyl-ethene-1-yl)-4,4'-dimethylphenyl, and 4,4'-bis(2,2-diphenyl-ethene-1-yl)-4,4'-di-(t-butyl)phenyl. Of those, the distyrylarylenes, the iridium complex derivatives, and the like are preferable because each of them has a high color purity and high luminous efficiency.

Further, the blue light-emitting layer 5 preferably contains the blue light-emitting material (dopant) and a blue host material. In this case, the layer can emit blue light with high luminous efficiency.

Examples of the blue host material that can be used in the blue light-emitting layer 5 include: distyrylarylenes; stilbenes; carbazole derivatives; triarylamines; quinolinolate-based metal complexes such as aluminum bis(2-methyl-8-quinolinolate)(p-phenylphenolate); and 4,4'-bis(2,2-diarylvinyl)biphenyls. In addition, the examples include phosphorescent substances such as iridium(III) bis[4,6-difluorophenyl-pyridinate-N,$C^{2'}$]picolinate and iridium bis[4,6-difluorophenyl-pyridinate-N,$C^{2'}$] (acetylacetonate). A material of which the blue light-emitting layer 5 is formed can be appropriately selected from those materials; the use of a material capable of emitting, with high efficiency, pure blue light the chromaticity coordinates (x, y) of which each show a small value provides a light source having high color rendering property and consuming low power.

In addition, the content (doping amount) of the blue light-emitting material (dopant) is preferably 0.05 wt % or more and 40 wt % or less, or more preferably 0.1 wt % or more and 20 wt % or less with respect to a blue host material.

The blue light-emitting layer 5 can be formed of any one of those materials by a known film formation method such as sputtering, ion plating, vacuum co-vapor deposition, spin coating, or electron beam co-vapor deposition. The thickness of the blue light-emitting layer 5 is preferably 0.6 nm to 70 nm, or more preferably 5 nm to 60 nm.

The green light-emitting layer 6 is a layer containing at least the green light-emitting material. The green light-emitting material in the green light-emitting layer 6 emits green light when excitons in the material return to their ground state. A material satisfying the above-mentioned relationship of Δx appropriately selected from, for example, known materials each having an ability to emit green light can be used as the green light-emitting material.

As the green light-emitting material, for example, there may be mentioned cumarin derivatives, quinacridone derivatives, quinolinolate-based metal complexes, distyrylamine derivatives, iridium complexes, and anthracene derivatives. More specifically, there may be mentioned arylanthracene, 1,1,7,7-tetramethyl-10-(benzothiazole-2-yl)-2,3,6,7-tetrahydro-1H,5H,11H-[1]benzopyrano[6,7,8-ij]quinolidine-11-one as a cumarin derivative (trivial name: cumarin 545 tetramethyl), Ir(ppy)3 as a iridium complex, and the like. Of those, cumarin derivatives and iridium complexes are preferred with view to high efficiency.

Further, green light-emitting layer 6 preferably includes a green light-emitting material (dopant) and a green host material. In the foregoing, green can be emitted with high luminous efficiency.

As the green host material that can be used in the green light-emitting layer 6, for example, there may be mentioned distyryl arylenes, stilbenes, carbazole derivatives, triarylamines, quinolinolate-based metal complexes, and 4,4'-bis (2,2-diarylvinyl)biphenyls. More specifically, there may be mentioned aluminum tris(8-quinolinolate), aluminum bis(2-methyl-8-quinolinolate), and the like. In addition, a phosphor such as fac-tris(2-phenylpyridine)iridium and the like may be exemplified. Of those, by using the same material as a blue host material included in the adjacent blue light-emitting layer 5, the kinds of the material to be used can be reduced.

In addition, the content (doping amount) of the green light-emitting material (dopant) is preferably 0.05 wt % or more and 40 wt % or less, or more preferably 0.1 wt % or more and 20 wt % or less with respect to a green host material.

The green light-emitting layer 6 can be formed of any one of those materials by a known film formation method such as sputtering, ion plating, vacuum co-vapor deposition, spin coating, or electron beam co-vapor deposition. The thickness of the green light-emitting layer 6 is preferably 1 nm to 30 nm, or more preferably 2 nm to 20 nm.

In embodiments of the present invention, preferable examples of the combination of dopant satisfying the above chromaticity coordinate, as red light-emitting dopant/blue light-emitting dopant/green light-emitting dopant, include 9,10-(1,4-diphenyl-naphthalene-2,3-diyl)[3,4-(1,4-diphenyl-naphthalene-2,3-diyl)perylene] (CIE chromaticity coordinate (0.66, 0.33))/9,9'-diethyl[3,3'-[(1,1-biphenyl-4,4'-diyl)bis(2,1-ethenediyl)]bis(9H-carbazole)] (CIE chromaticity coordinate (0.16, 0.18))/9,10-bis[N,N-di[4-(dimethylphenylmethyl)phenyl]]aminoanthracene (CIE chromaticity coordinate (0.32, 0.62)), PtOEP (CIE chromaticity coordinate (0.66, 0.32))/9,9'-diethyl[3,3'-[(1,4-phenylene)bis(2,1-ethenediyl)]bis(9H-carbazole)] (CIE chromaticity coordinate (0.16, 0.17))/9,10-bis[N,N-di([4-(dimethylphenylmethyl)phenyl]]aminoanthracene (CIE chromaticity coordinate (0.32, 0.62)), and Btp2Ir (acac) (CIE chromaticity coordinate (0.65, 0.33))/9,9'-diethyl[3,3'-[(1,1'-bisphenyl-4,4'-diyl)bis(2,1-ethenediyl)bis](9H-carbazole)] (CIE chromaticity coordinate (0.16, 0.18))/Ir(ppy)3 (CIE chromaticity coordinate (0.31, 0.61), and the like.

Substrate 1 is a plate-like member for supporting a white light-emitting organic EL device. Each of the layers forming the white light-emitting organic EL device is very thin, and thus the white light-emitting organic EL device is generally produced as a white light-emitting organic EL device supported on the substrate 1. For this purpose, the substrate 1 preferably has surface smoothness. In the case where the substrate 1 is provided on the light emission side, the substrate 1 used is transparent to light to be extracted.

Thus, a known substrate may be appropriately used as the substrate 1 described above as long as it has the above-mentioned properties. Examples thereof include: ceramic substrates such as glass substrates, silicon substrates, or quartz substrates; plastic substrates; and metal substrates. A substrate having a metal foil formed thereon or the like may also be used. A hybrid substrate prepared by combining the same kind or different kinds of substrates may also be used.

The anode 2 is an electrode for injecting holes into a device. Thus, a material to be used for the anode 2 has only to be a material capable of providing the anode 2 with this property. In general, known materials such as metals, alloys, conductive compounds, or mixtures thereof may be appropriately selected.

Examples of the material to be used for the anode 2 described above include metal oxides or metal nitrides such as indium tin oxide (ITO), indium zinc oxide (IZO), indium tungsten oxide (IWO), tin oxide, zinc oxide, zinc aluminum oxide, or titanium nitride; a metal such as gold, platinum, silver, copper, aluminum, nickel, cobalt, lead, chromium, molybdenum, tungsten, tantalite, niobium, or alloy thereof, or alloy of copper iodide; and a conductive polymer such as polyaniline, polythiophene, polypyrrole, polyphenylene vinylene, poly(3-methylthiophene), or polyphenylene sulfide. The anode 2 may be formed of one kind of material described above, or formed of a mixture of a plurality of materials described above. Further, the anode 2 may have a multilayer structure formed of a plurality of layers with the homogeneous composition or heterogeneous composition.

The anode 2 can be formed by using the above-mentioned material through a known thin film formation method such as sputtering, ion plating, vacuum vapor deposition, spin coating, or electron beam vapor deposition. The thickness of the anode 2 varies depending on the material to be used, but is generally 5 nm or more and 1 μm or less, preferably 10 nm or more and 1 μm or less, more preferably 10 nm or more and 500 nm or less, particularly preferably 10 nm or more and 300 nm or less, and most preferably 10 nm or more and 200 nm or less. The anode 2 is set to have a sheet electrical resistance of preferably several hundreds Ω/sheet or less, and more preferably 5 Ω/sheet or more and 50 Ω/sheet or less.

The surface of the anode 2 (the surface in contact with the hole-transporting layer 3) is preferably subjected to UV ozone cleaning, oxygen plasma cleaning, or argon plasma cleaning. For suppression of short circuits or defects of the white light-emitting organic EL device, surface roughness is preferably controlled to a root mean square of 20 nm or less through a method of reducing particle size or a method of polishing after film formation.

In the case where the anode 2 has a high resistance, an auxiliary electrode may be provided to reduce the resistance. The auxiliary electrode is an electrode formed of a metal such as silver, copper, chromium, aluminum, titanium, aluminum alloy, or silver alloy, or a laminate thereof partly provided on the anode 2.

Note that in the case where the anode 2 is provided closer to the light emission side than the light emitting layer is provided, the anode 2 is generally formed to have a transmittance of more than 10% with respect to light to be emitted. In the case where the anode 2 is used as a reflective electrode, the material having a property of reflecting light extracted to the outside is arbitrarily selected from the above-mentioned materials. In general, a metal, an alloy, or a metal compound is selected.

The hole-transporting layer 3 is a layer that transports a hole injected from the anode 2 to an adjacent light-emitting layer (the red light-emitting layer 4 in this embodiment). An arbitrary material selected from known hole-transporting materials and electron-blocking materials can be appropriately used in the hole-transporting layer 3. As the hole-transporting material and electron-blocking material, for example, there may be mentioned triamines, tetramines, benzidines, triarylamines, arylenediamine derivatives, phenylenediamine derivatives, paraphenylene diamine derivatives, methaphenylene diamine derivatives, 1,1-bis(4-diarylaminophenyl)cyclohexanes, 4,4'-di(diarylamino)biphenyls, bis[4-(diarylamino)phenyl]methanes, 4,4"-di(diarylamino)terphenyls, 4,4'''-di(diarylamino)quaterphenyls, 4,4'-di(diarylamino) diphenyl ethers, 4,4'-di(diarylamino)diphenyl sulfanes, and bis[4-(diarylamino)phenyl]dimethyl methanes, and bis[4-(diarylamino)phenyl]-di(trifluoromethyl)methanes. Of those, aryl-di(4-diarylaminophenyl)amines, trimers of triphenylamine, tetramers of triphenylamine, 4,4'-bis[N-(1-naphthyl)-N-phenylamino]biphenyl, and the like are preferred. The hole-transporting layer 3 may be formed of one kind of such materials as described above, or may be formed of a mixture of multiple kinds of the materials. Alternatively, the layer may be of a multilayer structure formed of multiple layers with the same composition or different compositions.

In addition, the hole-transporting layer 3 can be formed of any such material as described above by a known film formation method such as sputtering, ion plating, vacuum vapor deposition, spin coating, or electron beam vapor deposition. The thickness of the hole-transporting layer 3, which varies depending on the material to be used in the layer, is typically 5 nm or more and 5 μm or less.

It should be noted that the hole-transporting layer 3 is formed so as to be transparent to light to be extracted when the layer is provided closer to the light extraction side than an adjacent light-emitting layer (the red light-emitting layer 4 in this embodiment). Accordingly, a material transparent to the above light when formed into a thin film is appropriately selected from the above-mentioned materials of each of which the hole-transporting layer 3 can be formed, and the thin film is generally set to have a transmittance of more than 10% with respect to light to be extracted.

The electron-transporting layer 7 is a layer that transports electrons injected from the cathode 8 to an adjacent light-emitting layer (the green light-emitting layer 6 in this embodiment). An arbitrary material selected from known electron-transporting materials and hole-blocking materials can be appropriately used in the electron-transporting layer 7. As the electron-transporting material and hole-blocking material, for example, there may be mentioned metal phenolates, quinolinolate-based metal complexes, triazole derivatives, oxazole derivatives, oxadiazole derivatives, quinoxaline derivatives, quinoline derivatives, pyrrole derivatives, benzopyrrole derivatives, tetraphenylmethane derivatives, pyrazole derivatives, thiazole derivatives, benzothiazole derivatives, thiadiazole derivatives, thionaphthene derivatives, spiro-based compounds, imidazole derivatives, benzoimidazole derivatives, distyrylbenzene derivatives, silole derivatives, phenanthroline derivatives, triphenylmethane derivatives, and triphenylmethane derivatives. Of those, an electron-transporting material having a high electron mobility such as oxadiazole derivatives, silole derivatives, phenanthroline derivatives, or triphenylmethane derivatives is preferably used from the viewpoint of improvement in the luminous efficiency of the device; an electron-transporting material having a high glass transition temperature such as a quinolinolate-based metal complex is preferably used from the viewpoint of lengthening the lifetime of the device. In particular, 2,9-dimethyl-4,7-diphenylphenanthroline, aluminum tris(8-quinolinolate), aluminum bis(2-methyl-8-quinolinolate) (p-phenylphenolate), or the like are preferably used. The electron-transporting layer 7 may be formed of one kind of material described above, or formed of a mixture of a plurality of materials described above. Further, the electron-transporting layer 7 may have a multilayer structure formed of a plurality of layers with the homogeneous composition or heterogeneous composition.

The electron-transporting layer 7 can be formed by using the above-mentioned material through a known film formation method such as sputtering, ion plating, vacuum vapor deposition, spin coating, or electron beam vapor deposition. The thickness of the electron-transporting layer 7 varies depending on the material to be used, but is generally 5 nm or more and 5 μm or less.

Note that in the case where the electron-transporting layer 7 is provided closer to the light emission side than an adjacent light-emitting layer (green light-emitting layer 6 in this embodiment) is provided, the electron-transporting layer 7 must be formed transparent to light to be emitted. Thus, of the above-mentioned materials capable of forming the electron-transporting layer 7, a material capable of forming a thin film transparent to the light to be extracted is arbitrarily selected, and the thin film is generally formed to have a transmittance of more than 10% with respect to light to be extracted.

The cathode 8 is an electrode for injecting electrons into the device. An electrode material formed of a metal, alloy, conductive compound, or mixture thereof having a small work function is preferably used for the cathode 8, and an electrode material having a work function of less than 4.5 eV is preferably used for increasing electron injection efficiency. Examples of the electrode material include lithium, sodium, magnesium, gold, silver, copper, aluminum, indium, calcium, tin, ruthenium, titanium, manganese, chromium, yttrium, aluminum-calcium alloys, aluminum-lithium alloys, aluminum-magnesium alloys, magnesium-silver alloys, magnesium-indium alloys, lithium-indium alloys, sodium-potassium alloys, magnesium/copper mixtures, and aluminum/aluminum oxide mixtures. Further, known materials used for the anode 2 may also be used for the electrode material.

The cathode 8 may be formed of a single material described above, or formed of a plurality of materials described above. For example, addition of 5% or more and 10% or less of silver or copper to magnesium prevents oxidation of the cathode 8 and may enhance adhesiveness of the electron-transporting layer 7 to the cathode 8.

The cathode 8 can be formed by using the above-mentioned material through a known thin film formation method such as vacuum vapor deposition, sputtering, ionization vapor deposition, ion plating, or electron beam vapor deposition. The thickness of the cathode 8 varies depending on the material to be used, but is generally 5 nm or more and 1 μm or less, preferably 10 nm or more and 500 nm or less, and most preferably 50 nm or more and 200 nm or less. The cathode 8 is set to have a sheet electrical resistance of preferably several hundreds Ω/sheet or less.

Note that in the case where the cathode 8 is provided closer to the light emission side than the light emitting layer is provided, the cathode 8 is generally formed to have a transmittance of more than 10% with respect to light to be extracted. Then, a transparent conducting oxide is laminated thereon. In the case where the cathode 8 is used as a reflective electrode, a material having a property of reflecting light extracted to outside is arbitrarily selected from the above-mentioned materials. In general, a metal, an alloy, or a metal compound is selected.

A material to be used in the intermediate layer 9 is, for example, any one of the above-mentioned hole-transporting materials and electron-blocking materials each of which is used in the hole-transporting layer 3, or any one of the above-mentioned electron-transporting materials and hole-blocking materials each of which is used in the electron-transporting layer 7. In the case of the order in which the light-emitting layers are laminated like the white light-emitting organic EL device according to this embodiment, a hole-transporting material or an electron-blocking material is preferably used in the layer. In addition, a material that is not deactivated by receiving excitation energy from one or both of adjacent layers is desirably used in the intermediate layer 9. Accordingly, the intermediate layer 9 desirably has a larger energy gap than that of each of the adjacent layers. Further, the intermediate layer 9 desirably has a shallower electron affinity level than that of the adjacent blue light-emitting layer 5. As long as the intermediate layer 9 has such nature as described above, the recombination of a hole and an electron occurs on a side close to the cathode 8 from an interface between the intermediate layer 9 and the blue light-emitting layer 5. A recombination region is expected to expand from the interface between the blue light-emitting layer 5 and the intermediate layer 9 toward the cathode 8, and part of excitons are expected to be produced in the green light-emitting layer 6 as well. What region the distribution of the excitons expands to is determined by, for example, a balance between a positive carrier and a negative carrier at the interface. It should be noted that the term "blocking material" as used herein refers to a material having such a function that an electron or a hole is neither injected nor transported into the layer to which the material belongs.

In addition, the intermediate layer 9 can be formed of any such material as described above by a known film formation method such as sputtering, ion plating, vacuum vapor deposition, spin coating, or electron beam vapor deposition. The thickness of the intermediate layer 9 is preferably 0.1 nm or more and 20 nm or less, or more preferably 0.5 nm or more and 15 nm or less.

The layer structure of the white light-emitting organic EL device according to this embodiment is not limited to the above-mentioned one including the anode 2, the hole-transporting layer 3, the respective light-emitting layers, the intermediate layer 9, the electron-transporting layer 7, and the cathode 8, and a known layer such as a hole-injecting layer or an electron-injecting layer can be appropriately incorporated into or omitted from the layer structure.

Further, a protective layer (sealing layer or passivation film) may be provided on the side opposite to the substrate 1 for preventing the white light-emitting organic EL device from being in contact with oxygen or moisture.

Examples of a material to be used for the protective layer include organic polymer materials, inorganic materials, photo-curable resins, and heat-curable resins. A single material may be used alone as the protective layer, and a plurality of materials may be used in combination. The protective layer may also have a single layer structure or a multilayer structure.

Examples of the organic polymer material include: fluorine-based resins such as chlorotrifluoroethylene polymers, dichlorodifluoroethylene polymers, or copolymers of chlorotrifluoroethylene polymers and dichlorodifluoroethylene polymers; acrylic resins such as polymethylmethacrylate or polyacrylate; epoxy resins; silicone resins; epoxy silicone resins; polystyrene resins; polyester resins; polycarbonate resins; polyamide resins; polyimide resins; polyamideimide resins; polyparaxylene resins; polyethylene resins; and polyphenylene oxide resins.

Examples of the inorganic material include polysilazane, a diamond thin film, amorphous silica, electrically insulating glass, metal oxides, metal nitrides, metal hydrocarbons, and metal sulfides.

The white light-emitting organic EL device may be protected by being sealed in an inert substance such as paraffin, liquid paraffin, silicone oil, fluorocarbon oil, or zeolite-added fluorocarbon oil.

The white light-emitting organic EL device may obviously be protected by can sealing. To be specific, an organic layer of the hole-transporting layer, respective light-emitting layers, electron-transporting layer and the like may be sealed by a sealing member such as a sealing plate or a sealing vessel for blocking moisture or oxygen from the outside. The sealing member may be provided exclusively on a back surface of an electrode, or an entire white light-emitting organic EL device may be covered with the sealing member. The shape, size, thickness, and the like of the sealing member are not particularly limited as long as the organic layer may be sealed and outside air may be blocked. Examples of a material to be used for the sealing member include glass, stainless steel, metals (such as aluminum), plastics (such as polychlorotrifluoroethylene, polyester, or polycarbonate), or ceramics.

In the case where the sealing member is provided for the white light-emitting organic EL device, a sealing agent (adhesive) may be arbitrarily used. In the case where the entire white light-emitting organic EL device is covered with a sealing member, the sealing members may be heat sealed together without use of a sealing agent. Examples of the sealing agent that may be used include UV-curable resins, heat-curable resins, and two-component curable resins.

A moisture absorber or an inert liquid may be inserted into a space between a sealing vessel and a white light-emitting organic EL device. The moisture absorber is not particularly limited, and specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. Examples of the inert liquid that can be used include paraffins, liquid paraffins, fluorine-based solvents (such as perfluoroalkane, perfluoroamine, or perfluoroether), chlorine-based solvents, and silicone oils.

Embodiment 2

Figure 3:
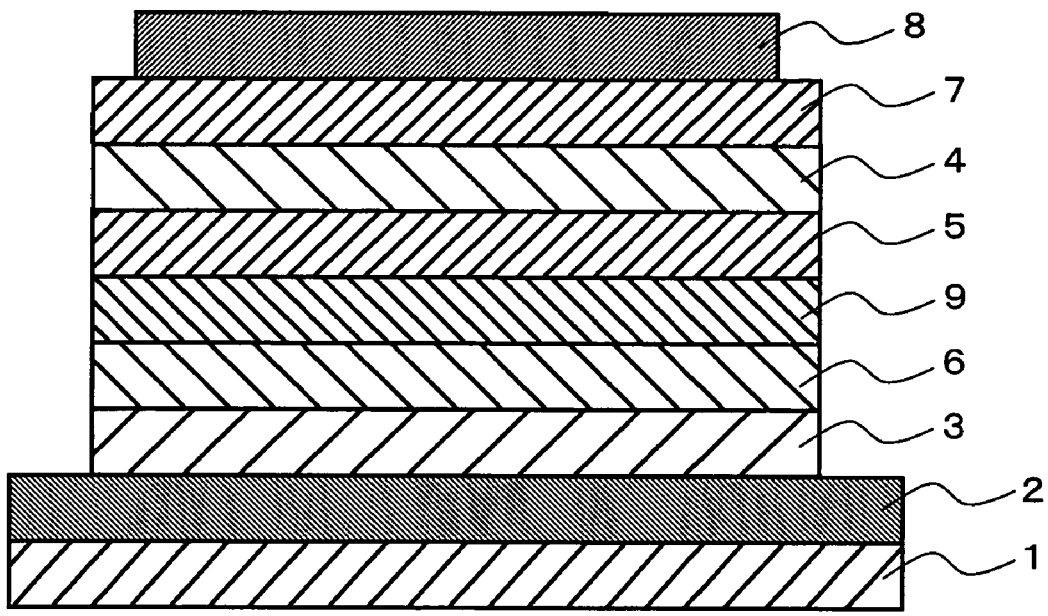
FIG. 3 is a view showing an example of the layer structure of a white light-emitting organic EL device according to Embodiment 2.

FIG. 3 shows an example of the layer structure of a white light-emitting organic EL device according to Embodiment 2. As shown in FIG. 3, the white light-emitting organic EL device according to Embodiment 2 is obtained by laminating, on the substrate 1, the anode 2, the hole-transporting layer 3, the green light-emitting layer 6 containing the green light-emitting material, the intermediate layer 9, the blue light-emitting layer 5 containing the blue light-emitting material, the red light-emitting layer 4 containing the red light-emitting material, the electron-transporting layer 7, and the cathode 8 sequentially. The device has the same structure as that of the white light-emitting organic EL device according to Embodiment 1 except for the order in which the red light-emitting layer 4 and the green light-emitting layer 6 are laminated. As in the case of Embodiment 1, $\Delta y$ represented as a difference between $y_R$ and $y_B$, and $\Delta x$ represented as a difference between $x_G$ and $x_t$ satisfy the following relationships:

$$\Delta y \leq 0.18$$

$$\Delta x \leq 0.10.$$

As long as light-emitting materials satisfying such relationships as described above are used, the chromaticity value x of the CIE chromaticity coordinates of white light emitted from the device can be brought close to the target chromaticity value $x_t$ by changing the thickness of the blue light-emitting layer 5, or the thickness ratio between the blue light-emitting layer 5 and the red light-emitting layer 4, and the chromaticity value y of the CIE chromaticity coordinates of the white light can be brought close to the target chromaticity value $y_t$ by increasing or decreasing the thickness of the intermediate layer 9.

That is, in the white light-emitting organic EL device constituted as described above, an increase in the thickness of the blue light-emitting layer 5, or an increase in the ratio of the thickness of the blue light-emitting layer 5 to the thickness of the red light-emitting layer 4 can decrease the chromaticity value x of the chromaticity coordinates of the color of emitted and extracted light (adjust the color to a bluish color tone) while leaving the chromaticity value y of the chromaticity coordinates of the color of the emitted and extracted light nearly unchanged. In contrast, a decrease in the thickness of the blue light-emitting layer 5, or a decrease in the ratio of the thickness of the blue light-emitting layer 5 to the thickness of the red light-emitting layer 4 can increase the chromaticity value x of the chromaticity coordinates of the color of the emitted and extracted light (adjust the color to a reddish color tone) while leaving the chromaticity value y of the chromaticity coordinates of the color of the emitted and extracted light nearly unchanged. In addition, a decrease in the thickness of the intermediate layer 9 can increase the chromaticity value y of the chromaticity coordinates of the color of the emitted and extracted light (adjust the color to a greenish color tone) while leaving the chromaticity value x of the chromaticity coordinates of the color of the emitted and extracted light nearly unchanged. In contrast, an increase in the thickness of the intermediate layer 9 can decrease the chromaticity value y of the chromaticity coordinates of the color of the emitted and extracted light while leaving the chromaticity value x of the chromaticity coordinates of the color of the emitted and extracted light nearly unchanged.

In the case of the order in which the light-emitting layers are laminated like the white light-emitting organic EL device according to this embodiment, a hole-transporting material or an electron-blocking material is a preferable material to be used in the intermediate layer 9.

It should be noted that, in this embodiment, the other layer structure and a usable material are identical to those of Embodiment 1, so the same parts as those of FIG. 1 are provided with the same reference numerals and their description is omitted.

The layer structure of the white light-emitting organic EL device according to this embodiment is not limited to the above-mentioned one including the anode 2, the hole-transporting layer 3, the respective light-emitting layers, the intermediate layer 9, the electron-transporting layer 7, and the cathode 8, and a known layer such as a hole-injecting layer or an electron-injecting layer can be appropriately incorporated into or omitted from the layer structure.

Embodiment 3

Figure 4:
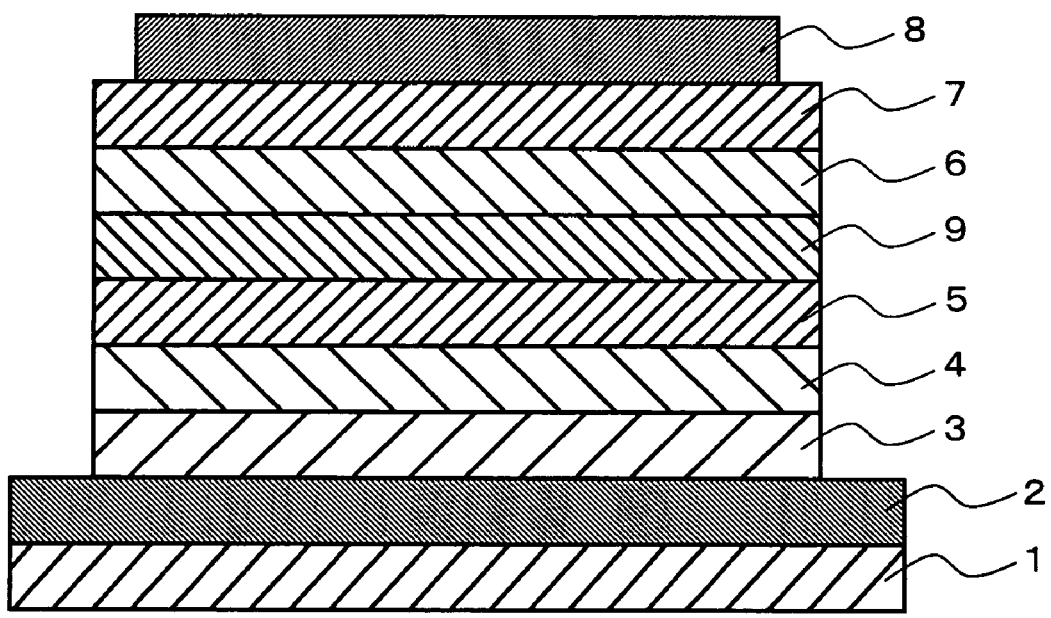
FIG. 4 is a view showing an example of the layer structure of a white light-emitting organic EL device according to Embodiment 3.

FIG. 4 shows an example of the layer structure of a white light-emitting organic EL device according to Embodiment 3. As shown in FIG. 4, the white light-emitting organic EL device according to Embodiment 3 is obtained by laminating, on the substrate 1, the anode 2, the hole-transporting layer 3, the red light-emitting layer 4 containing the red light-emitting material, the blue light-emitting layer 5 containing the blue light-emitting material, the intermediate layer 9, the green light-emitting layer 6 containing the green light-emitting material, the electron-transporting layer 7, and the cathode 8 sequentially. The device has the same structure as that of the white light-emitting organic EL device according to Embodiment 1 except that the intermediate layer 9 is provided between the blue light-emitting layer 5 and the green light-emitting layer 6. As in the case of Embodiment 1, $\Delta y$ represented as a difference between $y_R$ and $y_B$, and $\Delta x$ represented as a difference between $x_G$ and $x_t$ satisfy the following relationships:

$$\Delta y \leq 0.18$$

$$\Delta x \leq 0.10.$$

As long as light-emitting materials satisfying such relationships as described above are used, the chromaticity value x of the CIE chromaticity coordinates of white light emitted from the device can be brought close to the target chromaticity value $x_t$ by changing the thickness of the blue light-emitting layer 5, or the thickness ratio between the blue light-emitting layer 5 and the red light-emitting layer 4, and the chromaticity value y of the CIE chromaticity coordinates of the white light can be brought close to the target chromaticity value $y_t$ by increasing or decreasing the thickness of the intermediate layer 9.

That is, in the white light-emitting organic EL device constituted as described above, an increase in the thickness of the blue light-emitting layer 5, or an increase in the ratio of the thickness of the blue light-emitting layer 5 to the thickness of the red light-emitting layer 4 can decrease the chromaticity value x of the chromaticity coordinates of the color of emitted and extracted light (adjust the color to a bluish color tone) while leaving the chromaticity value y of the chromaticity coordinates of the color of the emitted and extracted light nearly unchanged. In contrast, a decrease in the thickness of the blue light-emitting layer 5, or a decrease in the ratio of the thickness of the blue light-emitting layer 5 to the thickness of the red light-emitting layer 4 can increase the chromaticity value x of the chromaticity coordinates of the color of the emitted and extracted light (adjust the color to a reddish color tone) while leaving the chromaticity value y of the chromaticity coordinates of the color of the emitted and extracted light nearly unchanged. In addition, a decrease in the thickness of the intermediate layer 9 can increase the chromaticity value y of the chromaticity coordinates of the color of the emitted and extracted light (adjust the color to a greenish color tone) while leaving the chromaticity value x of the chromaticity coordinates of the color of the emitted and extracted light nearly unchanged. In contrast, an increase in the thickness of the intermediate layer 9 can decrease the chromaticity value y of the chromaticity coordinates of the color of the emitted and extracted light while leaving the chromaticity value x of the chromaticity coordinates of the color of the emitted and extracted light nearly unchanged.

In the case of the order in which the light-emitting layers are laminated like the white light-emitting organic EL device according to this embodiment, an electron-transporting material or a hole-blocking material is a preferable material to be used in the intermediate layer 9.

It should be noted that, in this embodiment, the other layer structure and a usable material are identical to those of Embodiment 1, so the same parts as those of FIG. 1 are provided with the same reference numerals and their description is omitted.

The layer structure of the white light-emitting organic EL device according to this embodiment is not limited to the above-mentioned one including the anode 2, the hole-transporting layer 3, the respective light-emitting layers, the intermediate layer 9, the electron-transporting layer 7, and the

Embodiment 4

Figure 5:
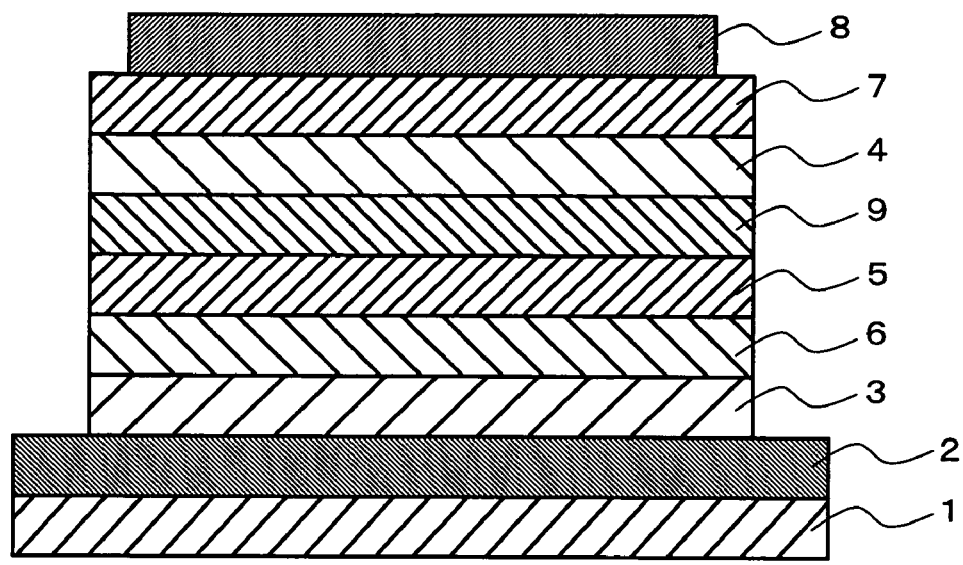
FIG. 5 is a view showing an example of the layer structure of a white light-emitting organic EL device according to Embodiment 4.

FIG. 5 shows an example of the layer structure of a white light-emitting organic EL device according to Embodiment 4. As shown in FIG. 5, the white light-emitting organic EL device according to Embodiment 4 is obtained by laminating, on the substrate 1, the anode 2, the hole-transporting layer 3, the green light-emitting layer 6 containing the green light-emitting material, the blue light-emitting layer 5 containing the blue light-emitting material, the intermediate layer 9, the red light-emitting layer 4 containing the red light-emitting material, the electron-transporting layer 7, and the cathode 8 sequentially. The device has the same structure as that of the white light-emitting organic EL device according to Embodiment 2 except that the intermediate layer 9 is provided between the blue light-emitting layer 5 and the red light-emitting layer 4. As in the case of Embodiment 1, $\Delta y$ represented as a difference between $y_R$ and $y_B$, and $\Delta x$ represented as a difference between $x_G$ and $x_t$ satisfy the following relationships:

$$\Delta y \leq 0.18$$

$$\Delta x \leq 0.10.$$

As long as light-emitting materials satisfying such relationships as described above are used, the chromaticity value x of the CIE chromaticity coordinates of the white light can be brought close to the target chromaticity value $x_t$ by increasing or decreasing the thickness of the intermediate layer 9, and the chromaticity value y of the CIE chromaticity coordinates of the white light can be brought close to the target chromaticity value $y_t$ by increasing or decreasing the thickness of the blue light-emitting layer 5 or by changing the thickness ratio between the blue light-emitting layer 5 and the green light-emitting layer 6.

That is, in the white light-emitting organic EL device constituted as described above, an increase in the thickness of the intermediate layer 9 can decrease the chromaticity value x of the chromaticity coordinates of the color of emitted and extracted light (adjust the color to a bluish color tone) while leaving the chromaticity value y of the chromaticity coordinates of the color of the emitted and extracted light nearly unchanged. In contrast, a decrease in the thickness of the intermediate layer 9 can increase the chromaticity value x of the chromaticity coordinates of the color of the emitted and extracted light (adjust the color to a reddish color tone) while leaving the chromaticity value y of the chromaticity coordinates of the color of the emitted and extracted light nearly unchanged. In addition, a decrease in the thickness of the blue light-emitting layer 5, or a decrease in the ratio of the thickness of the blue light-emitting layer 5 to the thickness of the green light-emitting layer 6 can increase the chromaticity value y of the chromaticity coordinates of the color of the emitted and extracted light (adjust the color to a greenish color tone) while leaving the chromaticity value x of the chromaticity coordinates of the color of the emitted and extracted light nearly unchanged. In contrast, an increase in the thickness of the blue light-emitting layer 5, or an increase in the ratio of the thickness of the blue light-emitting layer 5 to the thickness of the green light-emitting layer 6 can decrease the chromaticity value y of the chromaticity coordinates of the color of the emitted and extracted light while leaving the chromaticity value x of the chromaticity coordinates of the color of the emitted and extracted light nearly unchanged.

In the case of the order in which the light-emitting layers are laminated like the white light-emitting organic EL device according to this embodiment, an electron-transporting material or a hole-blocking material is a preferable material to be used in the intermediate layer 9.

It should be noted that, in this embodiment, the other layer structure and a usable material are identical to those of Embodiment 1, so the same parts as those of FIG. 1 are provided with the same reference numerals and their description is omitted.

The layer structure of the white light-emitting organic EL device according to this embodiment is not limited to the above-mentioned one including the anode 2, the hole-transporting layer 3, the respective light-emitting layers, the intermediate layer 9, the electron-transporting layer 7, and the cathode 8, and a known layer such as a hole-injecting layer or an electron-injecting layer can be appropriately incorporated into or omitted from the layer structure.

As described above, according to any one of Embodiments 1 to 4, the chromaticity coordinates (x, y) of white light (color of emitted and extracted light) emitted by the white light-emitting organic EL device can be adjusted independently, so the chromaticity coordinates (x, y) of the color of the emitted and extracted light can be easily adjusted to the target chromaticity coordinates $(x_t, y_t)$ with accuracy even when the chromaticity coordinates deviate from the target chromaticity coordinates.

According to the present invention, there can be provided a white light-emitting organic EL device the chromaticity coordinates of which can be easily adjusted to target ones with accuracy and a method of adjusting the chromaticity of the device.

Hereinafter, the present invention will be described in more detail with reference to examples. However, these are mere examples and the present invention is not limited there to.

Example 1

Example 1-1

An ITO layer (anode) having a thickness of 150 nm was formed on a transparent glass substrate with a reactive sputter. After that, the substrate was washed with an alkali. Then, the substrate was washed with pure water, dried, and cleaned with UV/ozone.

After the above cleaning the substrate was transferred to a vacuum vapor deposition apparatus (having a vacuum of about $5.0 \times 10^{-5}$ Pa), and a layer of N,N'-diphenyl-N,N'-bis[4'-[bis(3-methylphenyl)amino]biphenyl-4-yl]benzidine (represented by the following chemical formula (1)) having a thickness of 30 nm to serve as a hole-transporting layer was formed on the anode with a carbon crucible at a vapor deposition rate of 0.1 nm/s.

Chemical formula (1)

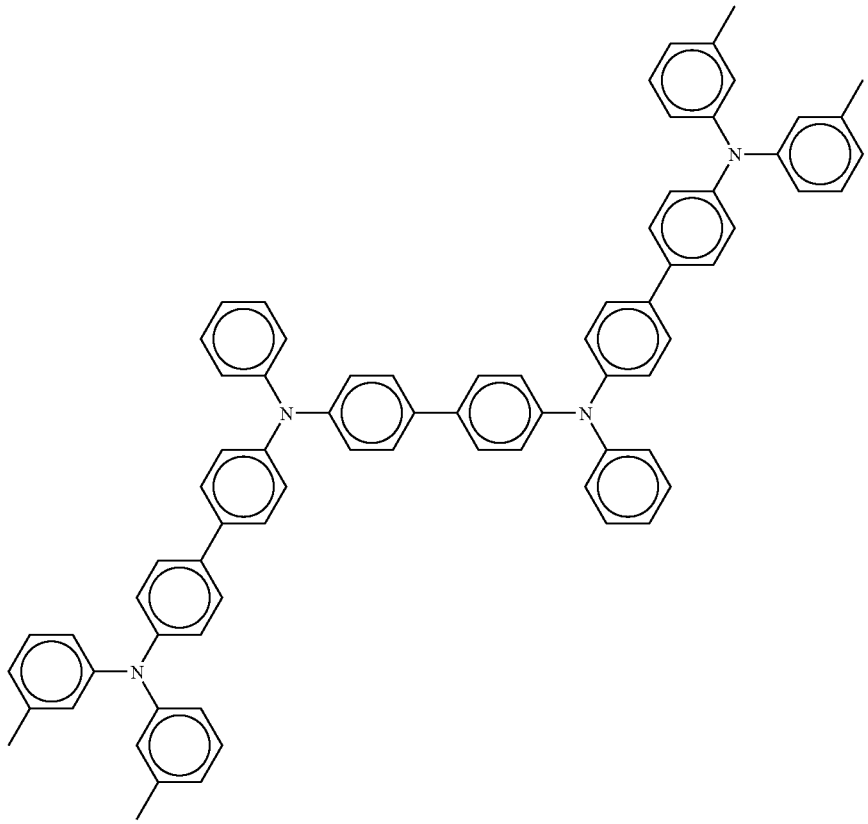

A co-vapor-deposited layer of 2-tert-butyl-9,10-bis(2-naphthyl)anthracene (represented by the following chemical formula (2)) as a red host material and 9,10-(1,4-diphenyl-naphthalene-2,3-diyl)[3,4-(1,4-diphenyl-naphthalene-2,3-diyl)perylene] (represented by the following chemical formula (3)) as a red light-emitting dopant (the doping amount of the dopant was 0.5 wt %) having a thickness of 5 nm to serve as a red light-emitting layer was formed on the hole-transporting layer with a carbon crucible at a vapor deposition rate of the red host material of 0.2 nm/s and a vapor deposition rate of the red light-emitting dopant of 0.001 nm/s.

-continued

Chemical formula (3)

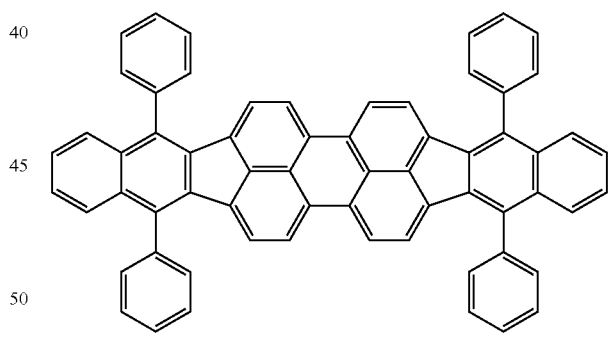

Chemical formula (2)

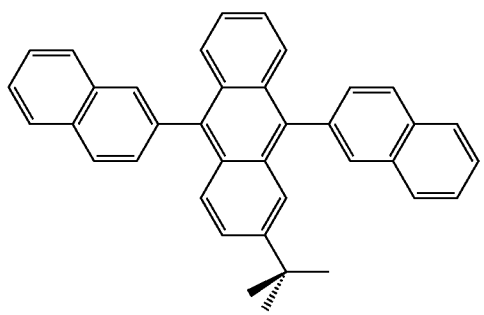

N,N'-diphenyl-N,N'-bis[4'-[bis(3-methylphenyl)amino]biphenyl-4-yl]benzidine (represented by the above chemical formula (1)) was formed into an intermediate layer having a thickness of 6.5 nm on the red light-emitting layer with a carbon crucible at a vapor deposition rate of 0.1 nm/s.

A co-vapor-deposited layer of 4,4'-bis(2,2-diphenylvinyl)biphenyl (represented by the following chemical formula (4)) as a blue host material and 9,9'-diethyl[3,3'-[(1,1'-biphenyl-4,4'-diyl)bis(2,1-ethenediyl)]bis(9H-carbazole)] (represented by the following chemical formula (5)) as a blue light-emitting dopant (the doping amount of the dopant was 7 wt %) having a thickness of 13 nm to serve as a blue light-emitting layer was formed on the intermediate layer with a carbon crucible at a vapor deposition rate of the blue host material of 0.1 nm/s and a vapor deposition rate of the blue light-emitting dopant of nm/s.

Chemical formula (4)

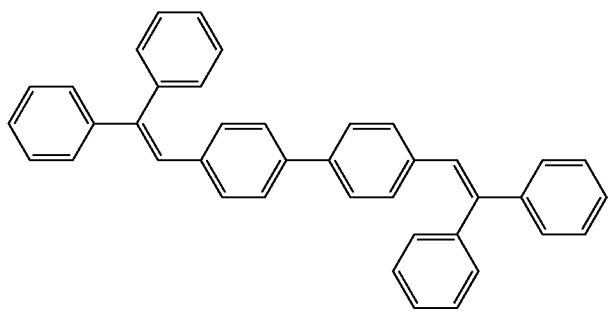

Chemical formula (5)

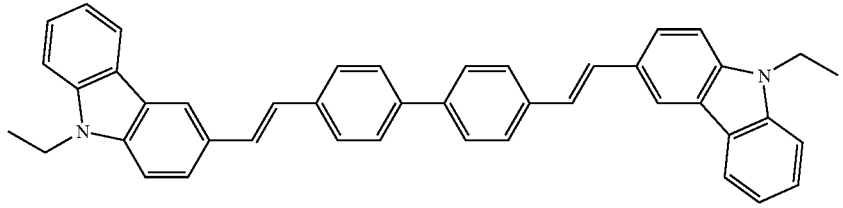

A co-vapor-deposited layer of 4,4'-bis(2,2-diphenylvinyl) biphenyl (represented by the above chemical formula (4)) as a green host material and 9,10-bis[N,N-di[4-dimethylphenyl-methyl)phenyl]]aminoanthracene (represented by the following chemical formula (6)) as a green light-emitting dopant (the doping amount of the dopant was 6 wt %) having a thickness of 16 nm to serve as a green light-emitting layer was formed on the blue light-emitting layer with a carbon crucible at a vapor deposition rate of the green host material of 0.1 nm/s and a vapor deposition rate of the green light-emitting dopant of 0.006 nm/s.

Chemical formula (6)

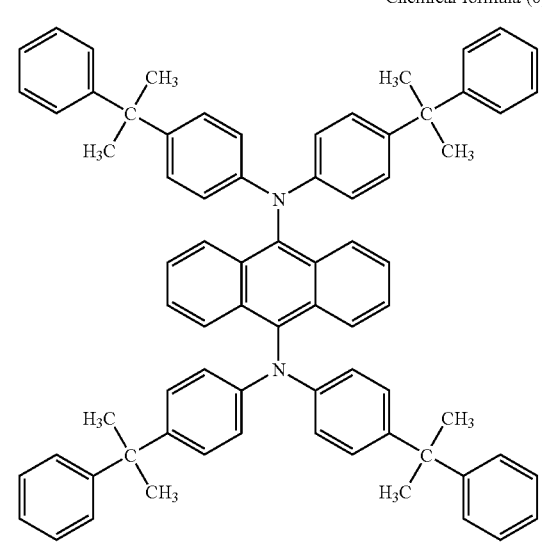

A layer of 2,9-dimethyl-4,7-diphenyl-1,10-phenanthroline having a thickness of 30 nm to serve as an electron-transporting layer was formed on the green light-emitting layer with a carbon crucible at a vapor deposition rate of 0.1 nm/s.

A lithium fluoride (LiF) layer having a thickness of 0.5 nm to serve as an electron-injecting layer was formed on the electron-transporting layer with a tungsten boat at a vapor deposition rate of 0.1 nm/s.

An aluminum (Al) layer having a thickness of 150 nm to serve as a cathode was formed on the electron-injecting layer with a tungsten boat at a vapor deposition rate of 1 nm/s, whereby a white light-emitting organic EL device was obtained. Here, target CIE chromaticity coordinates $(x_t, y_t)$ are (0.30, 0.30). The CIE chromaticity coordinates of the red light-emitting dopant in the red light-emitting layer are (0.66, 0.33), the CIE chromaticity coordinates of the blue light-emitting dopant in the blue light-emitting layer are (0.16, 0.18), and the CIE chromaticity coordinates of the green light-emitting dopant in the green light-emitting layer are (0.32, 0.62), so $\Delta y$ is determined to be 0.15 and $\Delta x$ is determined to be 0.02.

The resultant white light-emitting organic EL device was sealed with a glass cap, and its anode and cathode were connected through a known drive circuit so that its CIE chromaticity coordinates at room temperature and a luminance of 1,000 cd/m$^2$ were measured. As a result, the coordinates (x, y) were (0.352, 0.351). It should be noted that CIE chromaticity coordinates in each of the examples and comparative examples in the present invention were measured with an MCPD-7000 manufactured by OTSUKA ELECTRONICS CO., LTD.

Example 1-2

A white light-emitting organic EL device was produced in the same manner as in Example 1-1 except that the thickness of the intermediate layer was changed to 7.8 nm, and its CIE chromaticity coordinates were measured under conditions identical to those of Example 1-1.

Example 1-3

A white light-emitting organic EL device was produced in the same manner as in Example 1-1 except that the thickness of the intermediate layer was changed to 9.5 nm, and its CIE chromaticity coordinates were measured under conditions identical to those of Example 1-1.

Example 1-4

A white light-emitting organic EL device was produced in the same manner as in Example 1-1 except that: the thickness of the blue light-emitting layer was changed to 16 nm; and the thickness of the green light-emitting layer was changed to 13 nm, and its CIE chromaticity coordinates were measured under conditions identical to those of Example 1-1.

Example 1-5

A white light-emitting organic EL device was produced in the same manner as in Example 1-2 except that: the thickness of the blue light-emitting layer was changed to 16 nm; and the thickness of the green light-emitting layer was changed to 13 nm, and its CIE chromaticity coordinates were measured under conditions identical to those of Example 1-1.

Example 1-6

A white light-emitting organic EL device was produced in the same manner as in Example 1-3 except that: the thickness of the blue light-emitting layer was changed to 16 nm; and the thickness of the green light-emitting layer was changed to 13 nm, and its CIE chromaticity coordinates were measured under conditions identical to those of Example 1-1.

Example 1-7

A white light-emitting organic EL device was produced in the same manner as in Example 1-1 except that: the thickness of the blue light-emitting layer was changed to 19 nm; and the thickness of the green light-emitting layer was changed to 10 nm, and its CIE chromaticity coordinates were measured under conditions identical to those of Example 1-1.

Example 1-8

A white light-emitting organic EL device was produced in the same manner as in Example 1-2 except that: the thickness of the blue light-emitting layer was changed to 19 nm; and the thickness of the green light-emitting layer was changed to 10 nm, and its CIE chromaticity coordinates were measured under conditions identical to those of Example 1-1.

Example 1-9

A white light-emitting organic EL device was produced in the same manner as in Example 1-3 except that: the thickness of the blue light-emitting layer was changed to 19 nm; and the thickness of the green light-emitting layer was changed to 10 nm, and its CIE chromaticity coordinates were measured under conditions identical to those of Example 1-1.

Table 1 shows the results of the measurement of the CIE chromaticity coordinates of Examples 1-1 to 1-9.

TABLE 1

| | Blue light-emitting layer thickness (nm) | Intermediate layer thickness (nm) | Chromaticity x | Chromaticity y |
|---|---|---|---|---|
| Example 1-1 | 13 | 6.5 | 0.352 | 0.351 |
| Example 1-2 | 13 | 7.8 | 0.321 | 0.345 |
| Example 1-3 | 13 | 9.5 | 0.291 | 0.339 |
| Example 1-4 | 16 | 6.5 | 0.342 | 0.310 |
| Example 1-5 | 16 | 7.8 | 0.311 | 0.304 |
| Example 1-6 | 16 | 9.5 | 0.277 | 0.298 |
| Example 1-7 | 19 | 6.5 | 0.339 | 0.277 |
| Example 1-8 | 19 | 7.8 | 0.306 | 0.274 |
| Example 1-9 | 19 | 9.5 | 0.269 | 0.271 |

Figure 6:
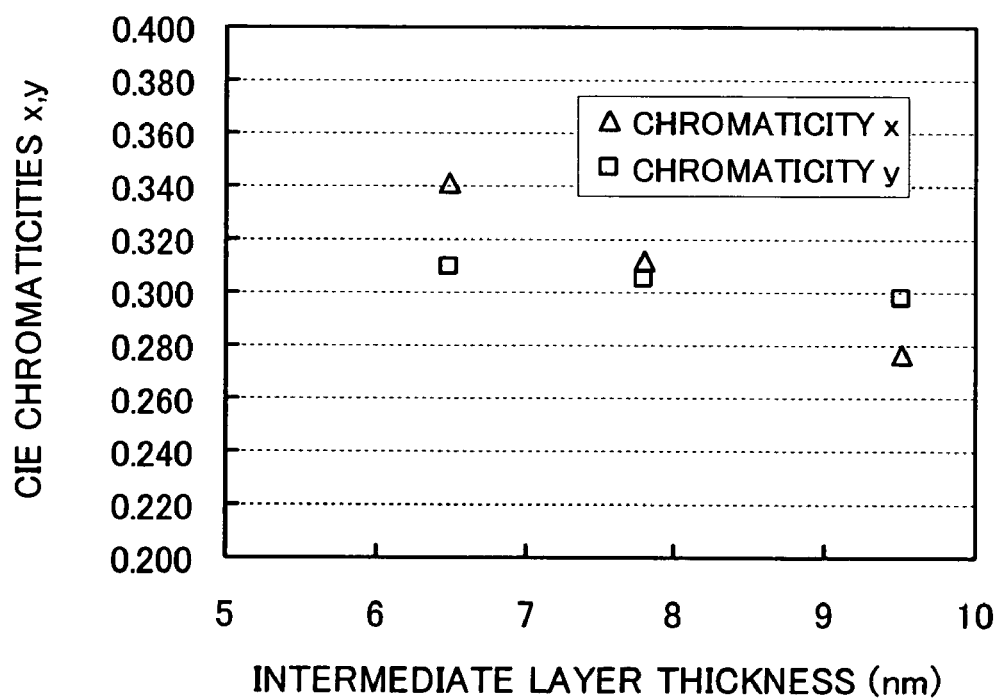
FIG. 6 is a view showing a relationship between the thickness of the intermediate layer of a white light-emitting organic EL device according to certain portions of Example 1 and the CIE chromaticity x or y of the device.
Figure 7:
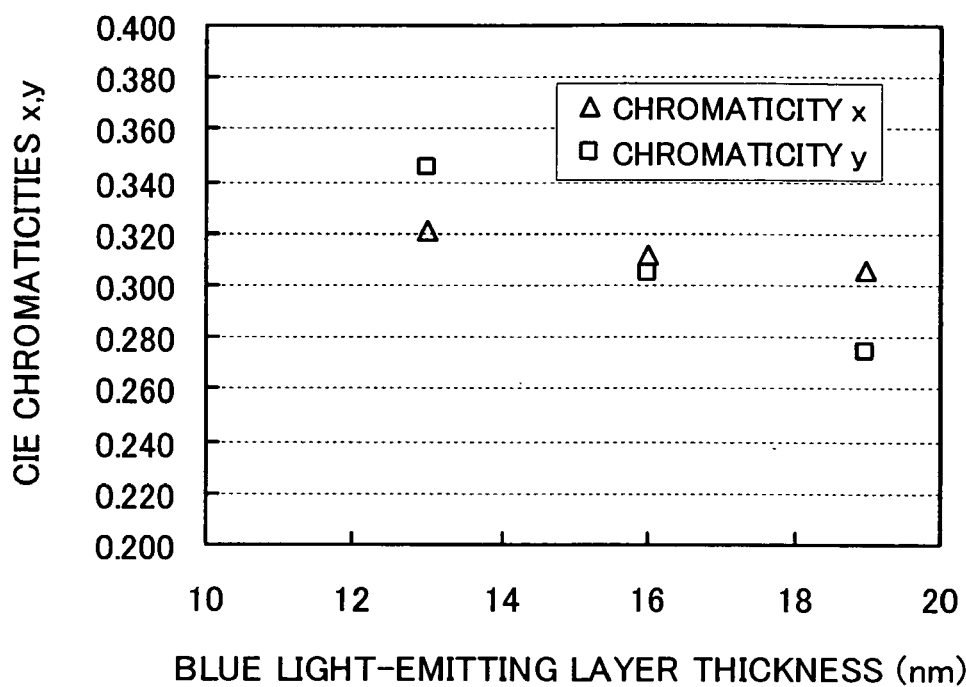
FIG. 7 is a view showing a relationship between the thickness of the blue light-emitting layer of the white light-emitting organic EL device according to certain portions of Example 1 and the CIE chromaticity x or y of the device.

In addition, FIG. 6 shows a relationship between the thickness of the intermediate layer and the CIE chromaticity x or y, and FIG. 7 shows a relationship between the thickness of the blue light-emitting layer and the CIE chromaticity x or y.

FIGS. 6 and 7 show that the chromaticity x strongly depends on the thickness of the intermediate layer, but is nearly independent of the thickness of the blue light-emitting layer. In addition, the figures show that the chromaticity y strongly depends on the thickness of the blue light-emitting layer, but is nearly independent of the thickness of the intermediate layer. Those findings mean that the chromaticity x and the chromaticity y can be adjusted independently, so target white light emission can be easily obtained in a short time period.

Example 1-10

A white light-emitting organic EL device having the target CIE chromaticity coordinates $(x_t, y_t)$, that is, (0.30, 0.30) was produced on the basis of the results of the measurement shown in Table 1. That is, a white light-emitting organic EL device was produced in the same manner as that described above except that: the thickness of the intermediate layer was changed to 8.3 nm; and the thickness of the blue light-emitting layer was changed to 16.3 nm. The resultant white light-emitting organic EL device was sealed with a glass cap, and its anode and cathode were connected through a known drive circuit so that its CIE chromaticity coordinates at room temperature and a luminance of 1,000 cd/m² were measured. As a result, the coordinates (x, y) were (0.298, 0.306), so the inventors were able to bring the chromaticities of the device close to the target ones easily. In addition, the production of a white light-emitting organic EL device was performed three additional times under conditions identical to those described above, and the CIE chromaticity coordinates of the devices were measured. As a result, the coordinates (x, y) were (0.301, 0.302), (0.299, 0.298), or (0.303, 0.303) (see Table 2), so the obtained results were excellent in repeatability. Table 2 shows the results of the measurement of the CIE chromaticity coordinates of Example 1-10.

TABLE 2

| | Blue light-emitting layer thickness (nm) | Intermediate layer thickness (nm) | Chromaticity x | Chromaticity y |
|---|---|---|---|---|
| Example 1-10 (n = 1) | 16.3 | 8.3 | 0.298 | 0.306 |

TABLE 2-continued

| | Blue light-emitting layer thickness (nm) | Intermediate layer thickness (nm) | Chromaticity x | Chromaticity y |
|---|---|---|---|---|
| Example 1-10 (n = 2) | 16.3 | 8.3 | 0.301 | 0.302 |
| Example 1-10 (n = 3) | 16.3 | 8.3 | 0.299 | 0.298 |
| Example 1-10 (n = 4) | 16.3 | 8.3 | 0.303 | 0.303 |

Example 2

An ITO layer (anode) having a thickness of 150 nm was formed on a transparent glass substrate with a reactive sputter. After that, the substrate was washed with an alkali. Then, the substrate was washed with pure water, dried, and cleaned with UV/ozone.

After the above cleaning the substrate was transferred to a vacuum vapor deposition apparatus (having a vacuum of about $5.0 \times 10^{-5}$ Pa), and a layer of copper phthalocyanine having a thickness of 10 nm to serve as a hole-injecting layer was formed on the anode with a carbon crucible at a vapor deposition rate of 0.1 nm/s.

A layer of tris[4-(N-(2-naphthyl)-N-phenylamino]phenyl] amine was formed into a hole-transporting layer having a thickness of 46 nm on the hole-injecting layer with a carbon crucible at a vapor deposition rate of 0.1 nm/s.

A co-vapor-deposited layer of 4,4'-bis(2,2-diphenylvinyl) biphenyl (represented by the above chemical formula (4)) as a green host material and 9,10-bis[N,N-di[4-dimethylphenyl-methyl)phenyl]]aminoanthracene (represented by the above chemical formula (6)) as a green light-emitting dopant (the doping amount of the dopant was 6 wt %) having a thickness of 13 nm to serve as a green light-emitting layer was formed on the hole-transporting layer with a carbon crucible at a vapor deposition rate of the green host material of 0.1 nm/s and a vapor deposition rate of the green light-emitting dopant of 0.006 nm/s.

A co-vapor-deposited layer of 4,4'-bis(2,2-diphenylvinyl) biphenyl (represented by the above chemical formula (4)) as a blue host material and 9,9'-diethyl[3,3'-[(1,4-phenylene)bis (2,1-ethenediyl)]bis(9H-carbazole)] (represented by the following chemical formula (7)) as a blue light-emitting dopant (the doping amount of the dopant was 7 wt %) having a thickness of 16 nm to serve as a blue light-emitting layer was formed on the green light-emitting layer with a carbon crucible at a vapor deposition rate of the blue host material of 0.1 nm/s and a vapor deposition rate of the blue light-emitting dopant of 0.0075 nm/s.

Chemical formula (7)

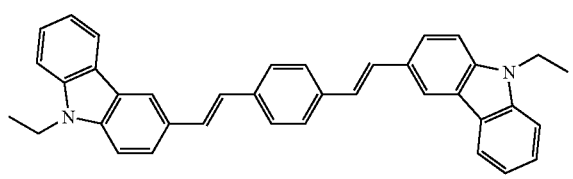

A layer of 2,9-diemethyl-4,7-diphenyl-1,10-phenanthrolin was formed into an intermediate layer having a thickness of 8.5 nm on the blue light-emitting layer with a carbon crucible at a vapor deposition rate of 0.1 nm/s.

A co-vapor-deposited layer of aluminum tris(8-quinolilate) as a red host material and 2-[2-[(E)-2-[(1,1,7,7-tetramethyl-2,3,6,7-tetrahydro-1H,5H-benzo(ij)quinolizine)-9-yl] ethenyl]-6-tert-butyl-4H-pyran-4-ylidene]malononitrile (represented by the following chemical formula (8)) as a red light-emitting dopant (the doping amount of the dopant was 4.5 wt %) having a thickness of 20 nm to serve as a red light-emitting layer was formed on the intermediate layer with a carbon crucible at a vapor deposition rate of the red host material of 0.1 nm/s and a vapor deposition rate of the red light-emitting dopant of 0.0045 nm/s.

Chemical formula (8)

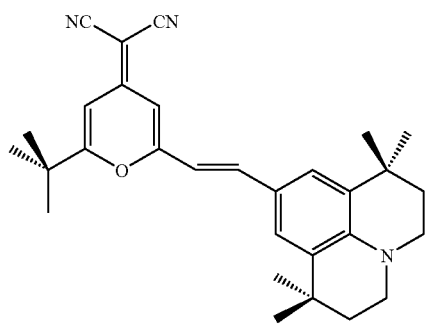

A layer of 2,9-dimethyl-4,7-diphenyl-1,10-phenanthroline having a thickness of 30 nm to serve as an electron-transporting layer was formed on the red light-emitting layer with a carbon crucible at a vapor deposition rate of 0.1 nm/s.

A lithium fluoride (LiF) layer having a thickness of 0.5 nm to serve as an electron-injecting layer was formed on the electron-transporting layer with a boron nitride crucible at a vapor deposition rate of 0.1 nm/s.

An aluminum (Al) layer having a thickness of 150 nm to serve as a cathode was formed on the electron-injecting layer with a tungsten boat at a vapor deposition rate of 1 nm/s, whereby a white light-emitting organic EL device was obtained. Here, the CIE chromaticity coordinates of the used red light-emitting dopant are (0.63, 0.34), the CIE chromaticity coordinates of the blue light-emitting dopant in the blue light-emitting layer are (0.16, 0.17), and the CIE chromaticity coordinates of the green light-emitting dopant in the green light-emitting layer are (0.32, 0.62), so $\Delta y$ is determined to be 0.17 and $\Delta x$ is determined to be 0.02.

The resultant white light-emitting organic EL device was sealed with a glass cap, and its anode and cathode were connected through a known drive circuit so that its CIE chromaticity coordinates at room temperature and a luminance of 1,000 cd/m² were measured. As a result, the coordinates (x, y) were (0.338, 0.259).

White light-emitting organic EL devices were each produced in the same manner as in any one of Examples 1 except that the thickness of the intermediate layer, and the thickness ratio between the blue light-emitting layer and the green light-emitting layer were variously changed, and their CIE chromaticity coordinates were measured. Table 3 shows the results of the measurement.

TABLE 3

| | Blue light-emitting layer thickness (nm) | Intermediate layer thickness (nm) | Chromaticity x | Chromaticity y |
|---|---|---|---|---|
| Example 2-1 | 16 | 8.5 | 0.338 | 0.259 |
| Example 2-2 | 16 | 7 | 0.314 | 0.261 |
| Example 2-3 | 16 | 5.5 | 0.284 | 0.265 |
| Example 2-4 | 13 | 8.5 | 0.336 | 0.299 |
| Example 2-5 | 10 | 8.5 | 0.332 | 0.321 |

Figure 8:
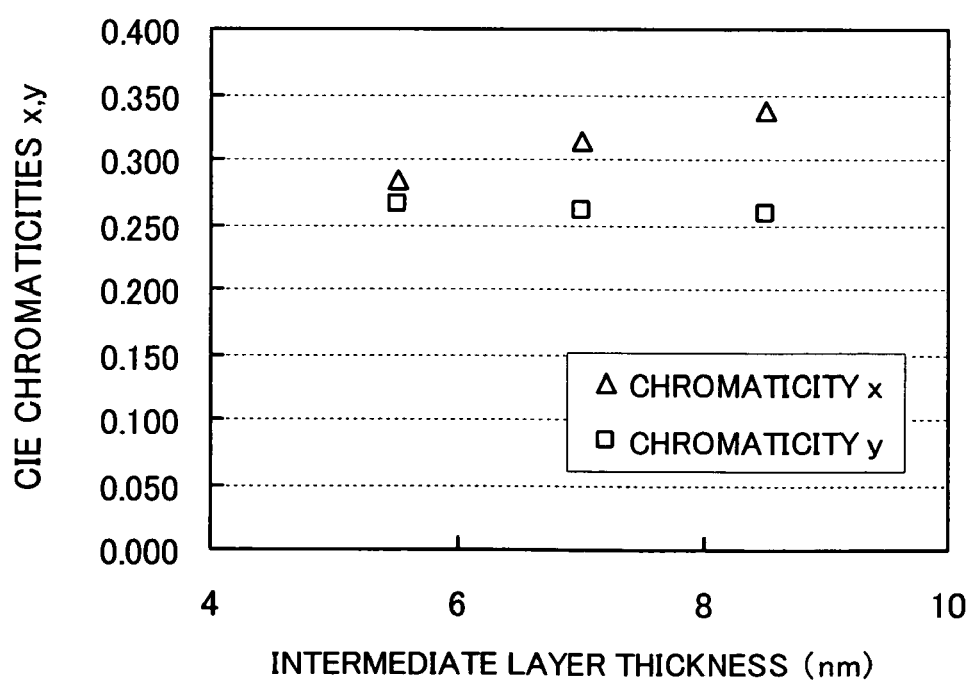
FIG. 8 is a view showing a relationship between the thickness of the intermediate layer of a white light-emitting organic EL device according to certain portions of Example 2 and the CIE chromaticity x or y of the device.
Figure 9:
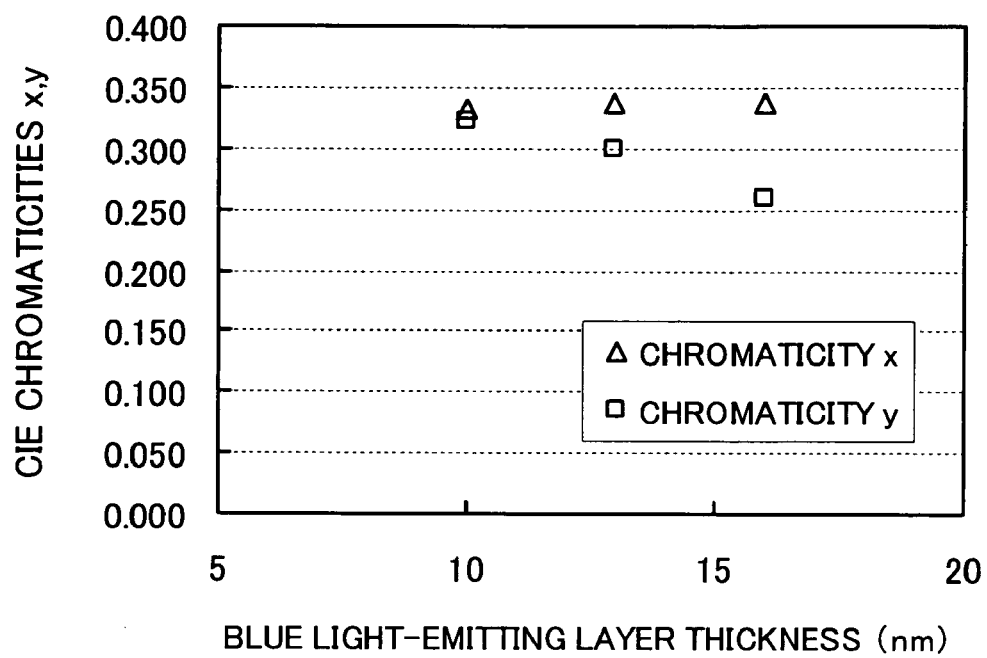
FIG. 9 is a view showing a relationship between the thickness of the blue light-emitting layer of the white light-emitting organic EL device according to certain portions of Example 2 and the CIE chromaticity x or y of the device.

In addition, FIG. 8 shows a relationship between the thickness of the intermediate layer and the CIE chromaticity x or y, and FIG. 9 shows a relationship between the thickness of the blue light-emitting layer and the CIE chromaticity x or y.

FIGS. 8 and 9 show that the chromaticity x strongly depends on the thickness of the intermediate layer, but is nearly independent of the thickness of the blue light-emitting layer. In addition, the figures show that the chromaticity y strongly depends on the thickness of the blue light-emitting layer, but is nearly independent of the thickness of the intermediate layer. Those findings mean that the chromaticity x and the chromaticity y can be adjusted independently, so target white light emission can be easily obtained in a short time period.

A white light-emitting organic EL device having the target CIE chromaticity coordinates $(x_t, y_t)$, that is, (0.30, 0.30) was produced on the basis of the results of the measurement shown in Table 3. That is, a white light-emitting organic EL device was produced in the same manner as that described above except that: the thickness of the intermediate layer was changed to 6.3 nm; the thickness of the blue light-emitting layer was changed to 13 nm; and the thickness of the green light-emitting layer was changed to 16 nm. The resultant white light-emitting organic EL device was sealed with a glass cap, and its anode and cathode were connected through a known drive circuit so that its CIE chromaticity coordinates at room temperature and a luminance of 1,000 cd/m² were measured. As a result, the coordinates (x, y) were (0.305, 0.297), so the inventors were able to bring the chromaticities of the device close to target ones easily.

Comparative Example 1

A white light-emitting organic EL device was produced in the same manner as in Example 1-1 except that 4-(dicyanomethylene)-2-methyl-6-[4-(dimethylamino)styryl]-4H-pyrane) (represented by the following chemical formula (9)) having CIE chromaticity coordinates of (0.59, 0.4) was used as a red light-emitting dopant. Here, target CIE chromaticity coordinates $(x_t, y_t)$ are (0.30, 0.30), so Δy is 0.22, Δx is 0.02, and Δy does not satisfy the relationship of Δy≦0.18.

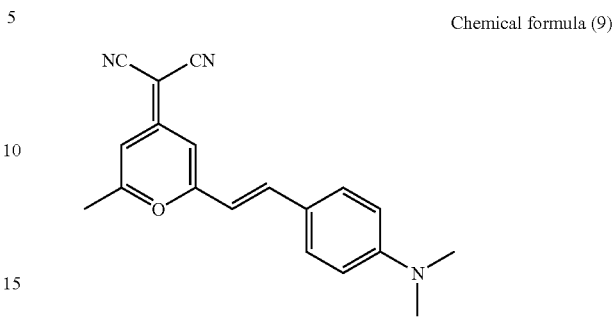

Chemical formula (9)

Figure 10:
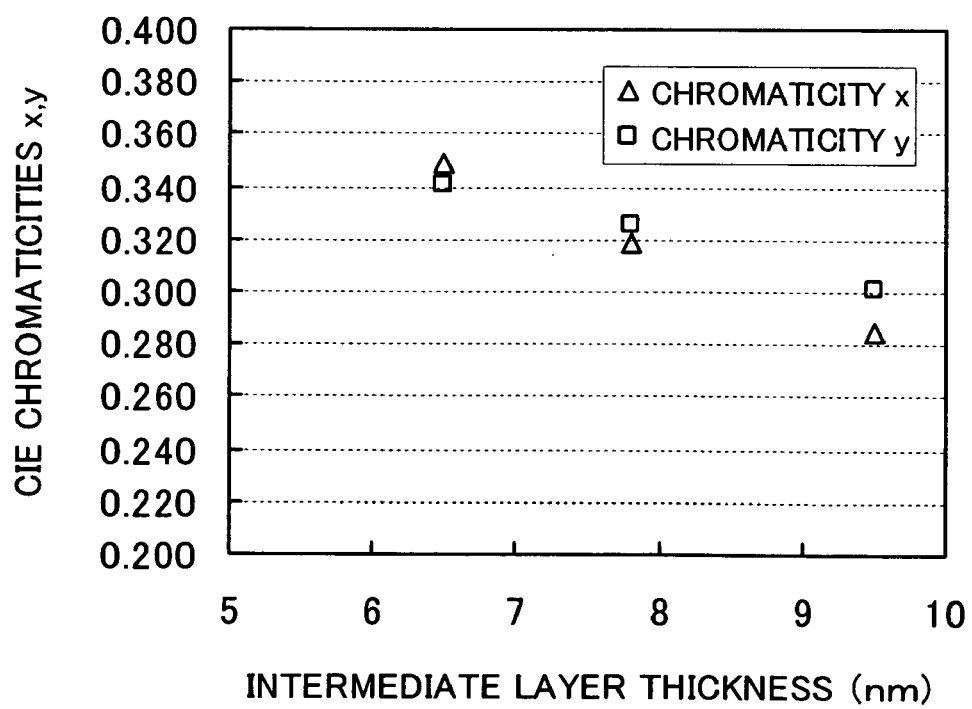
FIG. 10 is a view showing a relationship between the thickness of the intermediate layer of a white light-emitting organic EL device according to certain portions of Comparative Example 1 and the CIE chromaticity x or y of the device.
Figure 11:
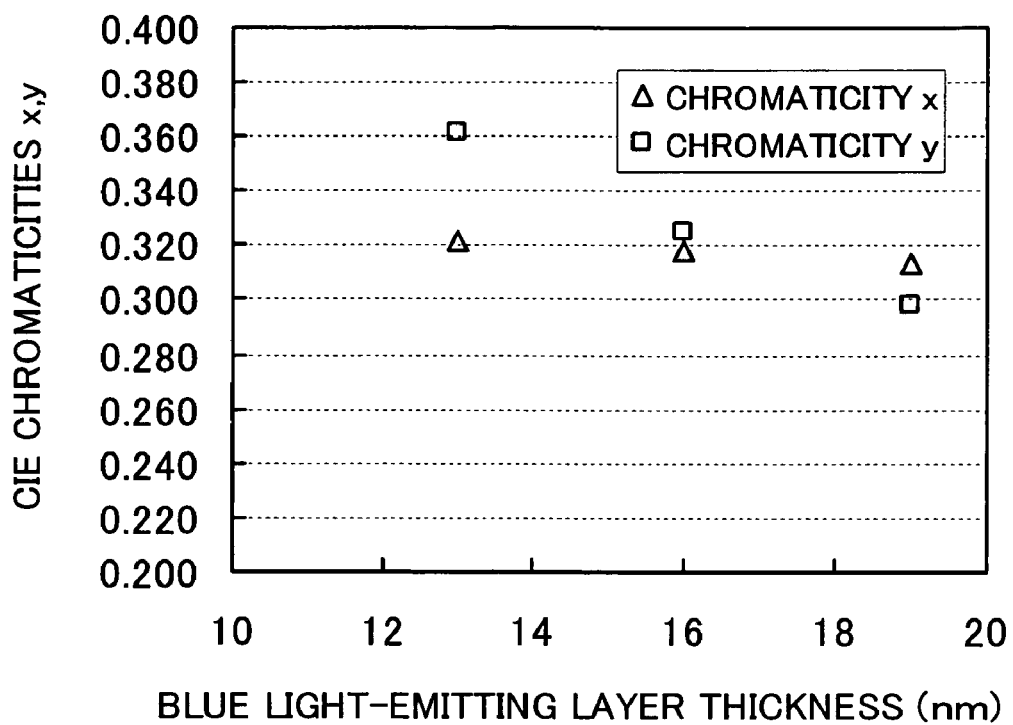
FIG. 11 is a view showing a relationship between the thickness of the blue light-emitting layer of the white light-emitting organic EL device according to certain portions of Comparative Example 1 and the CIE chromaticity x or y of the device.

The resultant white light-emitting organic EL device was sealed with a glass cap, and its anode and cathode were connected through a known drive circuit so that its CIE chromaticity coordinates at room temperature and a luminance of 1,000 cd/m² were measured. As a result, the coordinates (x, y) were (0.321, 0.361). White light-emitting organic EL devices were each produced in the same manner as in Example 1 by variously changing the thickness of the intermediate layer, and the thickness ratio between the blue light-emitting layer and the green light-emitting layer in order that the CIE chromaticity coordinates of a device to be obtained might be brought close to the target CIE chromaticity coordinates, in other words, (0.30, 0.30). Then, the CIE chromaticity coordinates of the devices were measured. FIG. 10 shows a relationship between the thickness of the intermediate layer and the chromaticity x or y, and FIG. 11 shows a relationship between the thickness of the blue light-emitting layer and the chromaticity x or y on the basis of the results of the measurement. FIG. 10 showed that both the chromaticities x and y strongly depended on the thickness of the intermediate layer, so it was difficult to adjust the chromaticities.

Comparative Example 2

Figure 12:
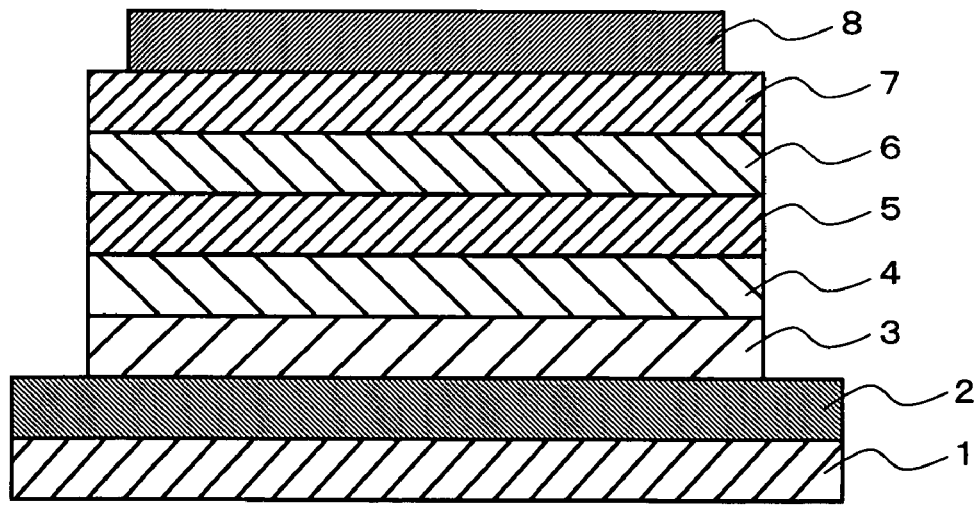
FIG. 12 is a view showing the layer structure of a white light-emitting organic EL device according to Comparative Example 2.

A white light-emitting organic EL device was produced in the same manner as in Example 1-1 except that the intermediate layer was not provided as shown in FIG. 12.

The resultant white light-emitting organic EL device was sealed with a glass cap, and its anode and cathode were connected through a known drive circuit so that its CIE chromaticity coordinates at room temperature and a luminance of 1,000 cd/m² were measured. As a result, the coordinates (x, y) were (0.491, 0.382). In view of the foregoing, white light-emitting organic EL devices were produced by variously changing the thickness ratio between the blue light-emitting layer and the green light-emitting layer, the doping amount of the red light-emitting dopant in the red light-emitting layer, and the thickness of the red light-emitting layer in order that the CIE chromaticity coordinates of a device to be obtained might be brought close to the target CIE chromaticity coordinates, in other words, (0.30, 0.30). Then, the CIE chromaticity coordinates of the devices were measured. Table 4 shows the results of the measurement.

TABLE 4

| | Blue light-emitting layer thickness (nm) | Red light-emitting dopant doping amount (%) | Red light-emitting layer thickness (nm) | Chromaticity x | Chromaticity y |
|---|---|---|---|---|---|
| Comparative Example 2-1 | 13 | 1.08 | 5 | 0.491 | 0.382 |
| Comparative Example 2-2 | 13 | 0.501 | 5 | 0.392 | 0.346 |
| Comparative Example 2-3 | 13 | 0.335 | 5 | 0.330 | 0.352 |
| Comparative Example 2-4 | 13 | 0.143 | 5 | 0.240 | 0.294 |
| Comparative Example 2-5 | 16 | 1.08 | 5 | 0.481 | 0.375 |
| Comparative Example 2-6 | 19 | 1.08 | 5 | 0.467 | 0.363 |
| Comparative Example 2-7 | 25 | 1.08 | 5 | 0.435 | 0.343 |
| Comparative Example 2-8 | 13 | 1.08 | 3 | 0.420 | 0.339 |
| Comparative Example 2-9 | 13 | 1.08 | 1 | 0.404 | 0.338 |

Table 4 shows that the chromaticities x and y do not depend on the thickness of each of the blue light-emitting layer and the red light-emitting layer, but depend almost only on the amount of the red light-emitting dopant. In addition, white light emission could not be obtained unless the doping amount of the red light-emitting dopant was made extremely small (0.3 wt % in the examples). This is probably because of the following reason: the red light-emitting dopant has a narrower energy gap than that of both the blue light-emitting dopant and the green light-emitting dopant, so the red light-emitting dopant is fundamentally apt to emit light. Therefore, it was found that a structure free of the intermediate layer required strict control of the doping amount of the red light-emitting dopant, so it was difficult to control the chromaticities of the structure.

What is claimed is:

1. A white light-emitting organic EL device, comprising:
    an anode;
    a cathode;
    at least a red light-emitting layer, a blue light-emitting layer, and a green light-emitting layer provided between the anode and the cathode; and
    an intermediate layer formed of one of a hole-transporting material, an electron-transporting material, a hole-blocking material, and an electron-blocking material and provided between any two adjacent layers of the respective light-emitting layers,
    wherein, when CIE chromaticity coordinates of a material incorporated into the red light-emitting layer responsible for emission of red light are represented by $(x_R, y_R)$, CIE chromaticity coordinates of a material incorporated into the blue light-emitting layer responsible for emission of blue light are represented by $(x_B, y_B)$, CIE chromaticity coordinates of a material incorporated into the green light-emitting layer responsible for emission of green light are represented by $(x_G, y_G)$, and target CIE chromaticity coordinates of white light emitted from the device are represented by $(x_t, y_t)$, $\Delta y$ represented as a difference between $y_R$ and $y_B$, and $\Delta x$ represented as a difference between $x_G$ and $x_t$ satisfy the following relationships:

$\Delta y \leq 0.18$ $\Delta x \leq 0.10$.

2. A white light-emitting organic EL device according to claim 1, wherein the intermediate layer has a larger energy gap than an energy gap of each of its adjacent light-emitting layers.

3. A white light-emitting organic EL device according to claim 1, wherein at least the red light-emitting layer, the intermediate layer formed of one of the hole-transporting material and the electron-blocking material, the blue light-emitting layer, the green light-emitting layer, and the cathode are provided in this order on the anode.

4. A white light-emitting organic EL device according to claim 1, wherein at least the green light-emitting layer, the intermediate layer formed of one of the hole-transporting material and the electron-blocking material, the blue light-emitting layer, the red light-emitting layer, and the cathode are provided in this order on the anode.

5. A white light-emitting organic EL device according to claim 1, wherein at least the red light-emitting layer, the blue light-emitting layer, the intermediate layer formed of one of the electron-transporting material and the hole-blocking material, the green light-emitting layer, and the cathode are provided in this order on the anode.

6. A white light-emitting organic EL device according to claim 1, wherein at least the green light-emitting layer, the blue light-emitting layer, the intermediate layer formed of one of the electron-transporting material and the hole-blocking material, the red light-emitting layer, and the cathode are provided in this order on the anode.

7. A method of adjusting a chromaticity of a white light-emitting organic EL device which comprises an anode; a cathode; at least a red light-emitting layer, a blue light-emitting layer, and a green light-emitting layer provided between the anode and the cathode; and an intermediate layer formed of one of a hole-transporting material, an electron-transporting material, a hole-blocking material, and an electron-blocking material and provided between any two adjacent layers of the respective light-emitting layers, and in which, when CIE chromaticity coordinates of a material incorporated into the red light-emitting layer responsible for emission of red light are represented by $(x_R, y_R)$, CIE chromaticity coordinates of a material incorporated into the blue light-emitting layer responsible for emission of blue light are represented by $(x_B, y_B)$, CIE chromaticity coordinates of a material incorporated into the green light-emitting layer responsible for emission of green light are represented by $(x_G, y_G)$, and target CIE chromaticity coordinates of white light emitted from the device are represented by $(x_t, y_t)$, $\Delta y$ represented as a difference between $y_R$ and $y_B$, and $\Delta x$ represented as a difference between $x_G$ and $x_t$ satisfy relationships of $\Delta y \leqq 0.18$ and $\Delta x \leqq 0.10$, the method comprising changing, when CIE chromaticity coordinates of the white light emitted from the white light-emitting organic EL device deviate from the target CIE chromaticity coordinates $(x_t, y_t)$, thicknesses of part of the layers selected from the respective light-emitting layers and the intermediate layer so that the white light approaches the target chromaticity value $x_t$, and thicknesses of part of the layers selected from the remainder of the respective light-emitting layers and the intermediate layer so that the white light approaches the target chromaticity value $y_t$.

8. A method of adjusting a chromaticity of a white light-emitting organic EL device according to claim 7, wherein:

the white light-emitting organic EL device comprises at least the red light-emitting layer, the intermediate layer formed of one of the hole-transporting material and the electron-blocking material, the blue light-emitting layer, the green light-emitting layer, and the cathode provided in this order on the anode; and the method comprises changing one of the thickness of the blue light-emitting layer and the thickness ratio between the blue light-emitting layer and the green light-emitting layer so that the white light approaches the target chromaticity value $y_t$, while changing the thickness of the intermediate layer so that the white light approaches the target chromaticity value $x_t$.

9. A method of adjusting a chromaticity of a white light-emitting organic EL device according to claim 7, wherein:

the white light-emitting organic EL device comprises at least the green light-emitting layer, the intermediate layer formed of one of the hole-transporting material and the electron-blocking material, the blue light-emitting layer, the red light-emitting layer, and the cathode provided in this order on the anode; and the method comprises changing the thickness of the intermediate layer so that the white light approaches the target chromaticity value $y_t$, while changing one of the thickness of the blue light-emitting layer and the thickness ratio between the blue light-emitting layer and the red light-emitting layer so that the white light approaches the target chromaticity value $x_t$.

10. A method of adjusting a chromaticity of a white light-emitting organic EL device according to claim 7, wherein:

the white light-emitting organic EL device comprises at least the red light-emitting layer, the blue light-emitting layer, the intermediate layer formed of one of the electron-transporting material and the hole-blocking material, the green light-emitting layer, and the cathode provided in this order on the anode; and the method comprises changing the thickness of the intermediate layer so that the white light approaches the target chromaticity value $y_t$, while changing one of the thickness of the blue light-emitting layer and the thickness ratio between the blue light-emitting layer and the red light-emitting layer so that the white light approaches the target chromaticity value $x_t$.

11. A method of adjusting a Chromaticity of a white light-emitting organic EL device according to claim 7, wherein:

the white light-emitting organic EL device comprises at least the green light-emitting layer, the blue light-emitting layer, the intermediate layer formed of one of the electron-transporting material and the hole-blocking material, the red light-emitting layer, and the cathode provided in this order on the anode; and the method comprises changing one of the thickness of the blue light-emitting layer and the thickness ratio between the blue light-emitting layer and the green light-emitting layer so that the white light approaches the target chromaticity value $y_t$, while changing the thickness of the intermediate layer so that the white light approaches the target chromaticity value $x_t$.

* * * * *